US012355000B2

(12) United States Patent
Sun et al.

(10) Patent No.: US 12,355,000 B2
(45) Date of Patent: Jul. 8, 2025

(54) PACKAGE COMPRISING A SUBSTRATE AND A HIGH-DENSITY INTERCONNECT INTEGRATED DEVICE

(71) Applicant: QUALCOMM Incorporated, San Diego, CA (US)

(72) Inventors: Yangyang Sun, San Diego, CA (US); Li-Sheng Weng, San Diego, CA (US); Zhimin Song, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 17/094,303

(22) Filed: Nov. 10, 2020

(65) Prior Publication Data

US 2022/0149005 A1    May 12, 2022

(51) Int. Cl.
| H01L 23/538 | (2006.01) |
| H01L 21/56 | (2006.01) |
| H01L 23/00 | (2006.01) |
| H01L 23/31 | (2006.01) |
| H01L 25/065 | (2023.01) |

(52) U.S. Cl.
CPC .......... *H01L 25/0655* (2013.01); *H01L 21/56* (2013.01); *H01L 23/31* (2013.01); *H01L 23/5381* (2013.01); *H01L 23/5385* (2013.01); *H01L 23/5386* (2013.01); *H01L 24/14* (2013.01)

(58) Field of Classification Search
CPC . H01L 2924/15153; H01L 2224/29021; H01L 23/5221; H01L 23/5381; H05K 2201/0936; H05K 2201/09072
See application file for complete search history.

(56) References Cited

U.S. PATENT DOCUMENTS

| 5,599,747 A | 2/1997 | Bhatt et al. |
| 5,723,906 A | 3/1998 | Rush |

(Continued)

FOREIGN PATENT DOCUMENTS

| CN | 112071826 A | 12/2020 |
| EP | 3275017 B1 | 7/2021 |

(Continued)

OTHER PUBLICATIONS

Partial International Search Report—PCT/US2021/054044—ISA/EPO—dated Jan. 19, 2022.

(Continued)

*Primary Examiner* — Nicholas J Tobergte
*Assistant Examiner* — William H Anderson
(74) *Attorney, Agent, or Firm* — Loza & Loza, LLP

(57) ABSTRACT

A package comprising a substrate, a first integrated device coupled to the substrate, a second integrated device coupled to the substrate, an interconnect integrated device coupled to the first integrated device and the second integrated device, and an underfill. The substrate includes a cavity. The interconnect integrated device is located over the cavity of the substrate. The underfill is located (i) between the first integrated device and the substrate, (ii) between the second integrated device and the substrate, (iii) between the interconnect integrated device and the first integrated device, and (iv) between the interconnect integrated device and the second integrated device.

32 Claims, 26 Drawing Sheets

*PROFILE VIEW*

(56) References Cited

U.S. PATENT DOCUMENTS

| | | |
|---|---|---|
| 6,304,455 B1 | 10/2001 | Huber et al. |
| 8,294,255 B2 | 10/2012 | Kim |
| 8,354,742 B2 | 1/2013 | Camacho et al. |
| 8,546,955 B1 | 10/2013 | Wu |
| 8,916,981 B2 | 12/2014 | Xiu et al. |
| 8,946,900 B2 | 2/2015 | Qian et al. |
| 9,059,179 B2 | 6/2015 | Karikalan et al. |
| 9,076,754 B2 | 7/2015 | Hung et al. |
| 9,368,450 B1 | 6/2016 | Gu et al. |
| 9,379,090 B1 | 6/2016 | Syed et al. |
| 9,607,919 B2 | 3/2017 | Lee et al. |
| 10,224,272 B2 | 3/2019 | Kim et al. |
| 10,304,799 B2 | 5/2019 | Leuten et al. |
| 10,361,170 B2 | 7/2019 | Pyo et al. |
| 10,380,496 B2 | 8/2019 | Elsherbini et al. |
| 10,418,329 B2 | 9/2019 | Li et al. |
| 10,497,674 B2 | 12/2019 | Hiner et al. |
| 10,510,669 B2 | 12/2019 | Braunisch et al. |
| 10,510,721 B2 | 12/2019 | Bhagavat et al. |
| 10,593,612 B2 | 3/2020 | Somma et al. |
| 10,600,706 B2 | 3/2020 | Lee |
| 10,784,232 B2 | 9/2020 | Hiner et al. |
| 11,133,259 B2* | 9/2021 | Rubin ............... H01L 24/14 |
| 11,282,806 B2 | 3/2022 | Sauter et al. |
| 11,569,198 B2 | 1/2023 | Burton |
| 2004/0065468 A1 | 4/2004 | Seuntjens |
| 2006/0226527 A1* | 10/2006 | Hatano ............ H01L 23/5389 |
| | | 438/109 |
| 2010/0052106 A1 | 3/2010 | Lee et al. |
| 2010/0213566 A1 | 8/2010 | Ho et al. |
| 2010/0327424 A1 | 12/2010 | Braunisch et al. |
| 2011/0042806 A1 | 2/2011 | Koide et al. |
| 2011/0122590 A1* | 5/2011 | Wilson ............... H01L 24/83 |
| | | 523/400 |
| 2011/0215448 A1 | 9/2011 | Cho et al. |
| 2014/0117552 A1 | 5/2014 | Qian et al. |
| 2014/0159228 A1 | 6/2014 | Teh et al. |
| 2014/0264791 A1 | 9/2014 | Manusharow et al. |
| 2014/0299999 A1* | 10/2014 | Hu .................... H01L 21/561 |
| | | 257/774 |
| 2015/0001717 A1 | 1/2015 | Karhade et al. |
| 2015/0001733 A1 | 1/2015 | Karhade et al. |
| 2015/0084210 A1 | 3/2015 | Chiu et al. |
| 2015/0091182 A1 | 4/2015 | Chiu et al. |
| 2015/0116965 A1 | 4/2015 | Kim et al. |
| 2016/0071818 A1* | 3/2016 | Wang ................. H01L 24/49 |
| | | 257/773 |
| 2016/0093597 A1 | 3/2016 | Chang et al. |
| 2016/0133571 A1 | 5/2016 | Lee et al. |
| 2016/0141234 A1 | 5/2016 | We et al. |
| 2016/0218082 A1 | 7/2016 | Lee et al. |
| 2016/0302308 A1* | 10/2016 | Lee .................... H01L 23/5385 |
| 2017/0178988 A1 | 6/2017 | Cheney et al. |
| 2018/0005945 A1 | 1/2018 | Pietambaram et al. |
| 2018/0040548 A1* | 2/2018 | Kim .................. H01L 21/4857 |
| 2018/0068980 A1 | 3/2018 | Clegg et al. |
| 2018/0102311 A1 | 4/2018 | Shih |
| 2018/0226364 A1 | 8/2018 | Kim et al. |
| 2019/0035757 A1 | 1/2019 | Yu et al. |
| 2019/0109117 A1 | 4/2019 | Fang et al. |
| 2019/0189603 A1 | 6/2019 | Wang et al. |
| 2019/0287908 A1 | 9/2019 | Dogiamis et al. |
| 2019/0295952 A1* | 9/2019 | Sikka ................. H01L 23/055 |
| 2020/0035603 A1 | 1/2020 | Rubin et al. |
| 2020/0035604 A1 | 1/2020 | Rubin et al. |
| 2020/0126928 A1 | 4/2020 | Cheah et al. |
| 2020/0294920 A1* | 9/2020 | Hariri ............... H01L 23/5381 |
| 2020/0381361 A1 | 12/2020 | Zhao et al. |
| 2020/0395313 A1* | 12/2020 | Mallik ................. H01L 25/50 |
| 2021/0020605 A1 | 1/2021 | Hiner et al. |
| 2021/0058085 A1 | 2/2021 | Clark et al. |
| 2021/0134711 A1 | 5/2021 | Fang |
| 2021/0134724 A1 | 5/2021 | Rubin et al. |
| 2021/0134728 A1 | 5/2021 | Rubin et al. |
| 2021/0320718 A1 | 10/2021 | Kalman et al. |
| 2021/0398906 A1 | 12/2021 | Qian et al. |
| 2022/0189917 A1 | 6/2022 | Balboni et al. |
| 2022/0199562 A1 | 6/2022 | Waidhas et al. |
| 2022/0285315 A1 | 9/2022 | Lee |
| 2022/0320026 A1 | 10/2022 | Sun et al. |
| 2022/0375838 A1 | 11/2022 | We |
| 2023/0035627 A1 | 2/2023 | Patil |
| 2023/0067914 A1* | 3/2023 | Lin .................... H01L 23/13 |

FOREIGN PATENT DOCUMENTS

| | | |
|---|---|---|
| KR | 20170126506 A | 11/2017 |
| TW | 200636972 A | 10/2006 |
| WO | 2017111790 A1 | 6/2017 |
| WO | 2017111957 A1 | 6/2017 |

OTHER PUBLICATIONS

International Search Report and Written Opinion—PCT/US2021/054044—ISA/EPO—dated Mar. 14, 2022.
Taiwan Search Report—TW110137318—TIPO—Jan. 6, 2025.

* cited by examiner

*PROFILE VIEW*

PROFILE VIEW

PROFILE VIEW

PROFILE VIEW

TOP PLAN VIEW

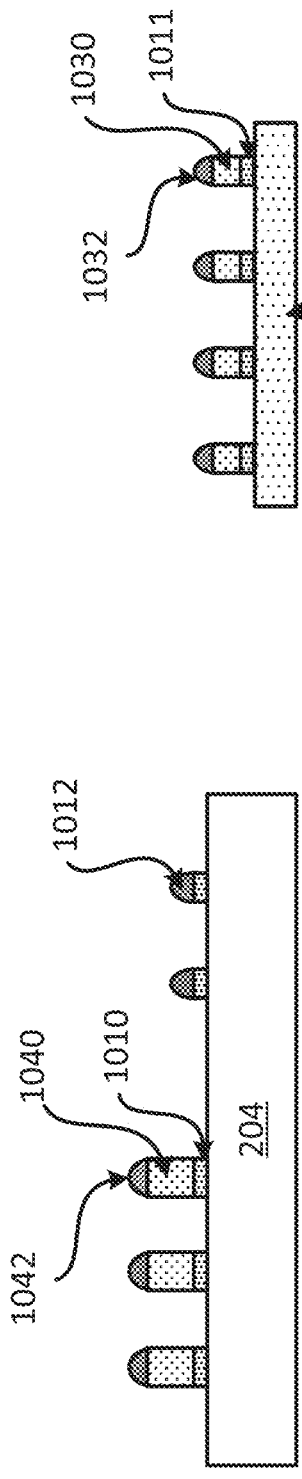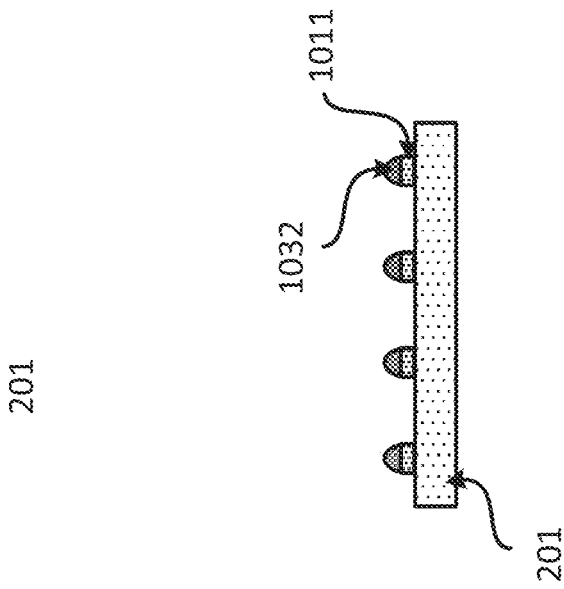
FIG. 10
FIG. 11

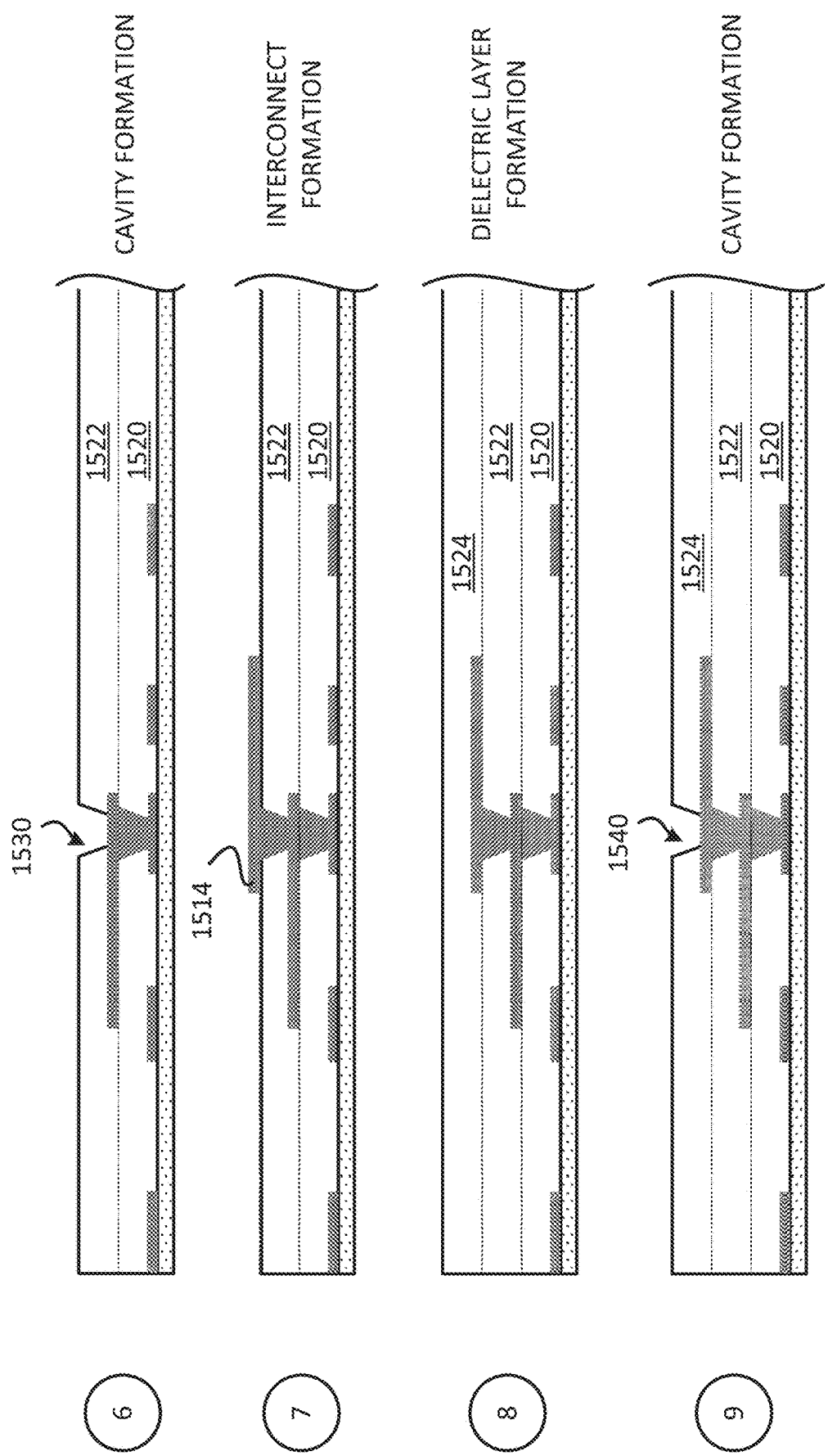

PACKAGE COMPRISING A SUBSTRATE AND A HIGH-DENSITY INTERCONNECT INTEGRATED DEVICE

FIELD

Various features relate to packages that include an integrated device, and more specifically to a package that includes an integrated device and a substrate.

BACKGROUND

FIG. 1 illustrates a package 100 that includes a substrate 102, an integrated device 104, and an integrated device 106. The substrate 102 includes at least one dielectric layer 120, a plurality of interconnects 122, and a plurality of solder interconnects 124. A plurality of solder interconnects 144 is coupled to the substrate 102 and the integrated device 104. A plurality of solder interconnects 164 is coupled to the substrate 102 and the integrated device 106. There is an ongoing need to provide more compact packages that can accommodate high density interconnects and/or high pin counts.

SUMMARY

Various features relate to packages that include an integrated device, and more specifically to a package that includes an integrated device and a substrate.

One example provides a package comprising a substrate, a first integrated device coupled to the substrate, a second integrated device coupled to the substrate, an interconnect integrated device coupled to the first integrated device and the second integrated device, and an underfill. The substrate includes a cavity. The interconnect integrated device is located over the cavity of the substrate. The underfill is located (i) between the first integrated device and the substrate, (ii) between the second integrated device and the substrate, (iii) between the interconnect integrated device and the first integrated device, and (iv) between the interconnect integrated device and the second integrated device.

Another example provides an apparatus that includes a substrate comprising a cavity, a first integrated device coupled to the substrate, a second integrated device coupled to the substrate, means for integrated device interconnection coupled to the first integrated device and the second integrated device, wherein the means for integrated device interconnection is located over the cavity of the substrate; and an underfill located (i) between the first integrated device and the substrate, (ii) between the second integrated device and the substrate, (iii) between the means for integrated device interconnection and the first integrated device, and (iv) between the means for integrated device interconnection and the second integrated device.

Another example provides a method for fabricating a package. The method provides a substrate comprising a cavity. The method couples a first integrated device to the substrate. The method couples a second integrated device to the substrate. The method couples an interconnect integrated device to the first integrated device and the second integrated device, where the interconnect integrated device is located over the cavity of the substrate. The method forms an underfill (i) between the first integrated device and the substrate, (ii) between the second integrated device and the substrate, (iii) between the interconnect integrated device and the first integrated device, and (iv) between the interconnect integrated device and the second integrated device.

BRIEF DESCRIPTION OF THE DRAWINGS

Various features, nature and advantages may become apparent from the detailed description set forth below when taken in conjunction with the drawings in which like reference characters identify correspondingly throughout.

FIG. 10 illustrates a profile view of an integrated device and an interconnect integrated device comprising pillar interconnects.

FIG. 11 illustrates a profile view of an integrated device and an interconnect integrated device comprising pillar interconnects.

FIGS. 15A-15C illustrate an exemplary sequence for fabricating a substrate.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, a first integrated device coupled to the substrate, a second integrated device coupled to the substrate, an interconnect integrated device coupled to the first integrated device and the second integrated device, and an underfill. The substrate includes a cavity. The interconnect integrated device is located over the cavity of the substrate. The underfill is located (i) between the first integrated device and the substrate, (ii) between the second integrated device and the substrate, (iii) between the interconnect integrated device and the first integrated device, and (iv) between the interconnect integrated device and the second integrated device. The interconnect integrated device may include a high-density interconnect integrated device that is configured to have interconnects with a lower minimum width and spacing than the minimum width and spacing of interconnects from the substrate. The interconnect integrated device may be configured to allow currents to travel between integrated devices, while bypassing a substrate, which has higher minimum width and/or spacing for interconnects. The interconnect integrated device may enable a package to have a small and compact form factor, while also providing a high input/output (I/O) pin count. The interconnect integrated device may provide improved voltage drop for integrated device, shorter paths between integrated devices and/or lower inductance. The underfill may help provide strong structural integrity for the interconnect integrated device, which in turns helps provide a package that includes reliable interconnects between two or more integrated devices.

Exemplary Package Comprising a High Density Interconnect Integrated Device

Figure 1:
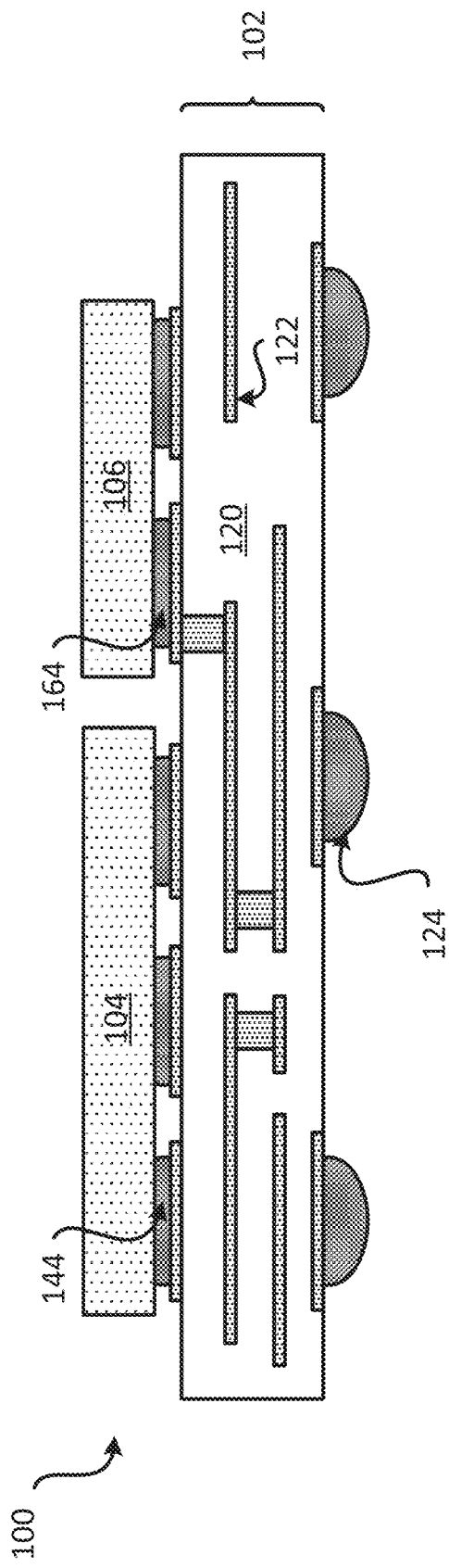
FIG. 1 illustrates a profile view of a package that includes an integrated device and a substrate.
Figure 2:
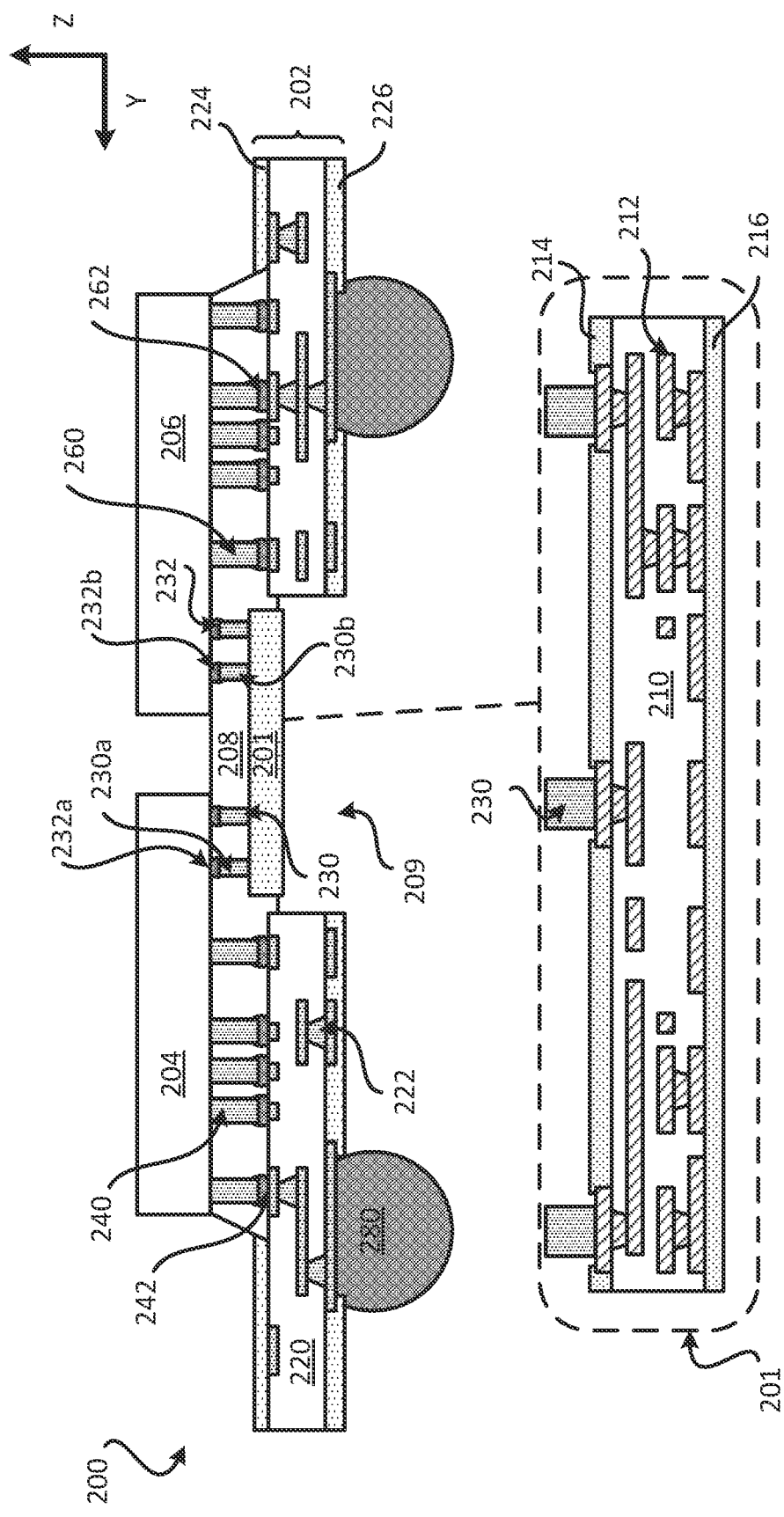
FIG. 2 illustrates a profile view of a package that includes a high-density interconnect integrated device.

FIG. 2 illustrates a profile view of a package 200 that includes a high-density interconnect integrated device. The package 200 may be coupled to a board (e.g., printed circuit board (PCB)) through a plurality of solder interconnects 280. The package 200 provides a package with a compact small factor while also having a high input/output pin count. As will be further described below, the package 200 provides shorter paths between integrated devices, lower inductance, and/or less routing constraints.

As shown in FIG. 2, the package 200 includes an interconnect integrated device 201, a substrate 202, a first integrated device 204, a second integrated device 206, and an underfill 208. The interconnect integrated device 201 may be configured as a bridge (e.g., bridge die) between two or more integrated devices. As will be further described below, the integrated devices (e.g., 204, 206) and the interconnect integrated device 201 may be coupled together in such a way that when at least one electrical signal (e.g., first electrical signal, second electrical signal) travels between at least two integrated devices (e.g., 204, 206), the electrical signal travels through the interconnect integrated device 201, and bypasses the substrate 202. The at least one electrical signal may travel through at least one electrical path that is defined by interconnects of the package, the integrated device(s), the substrate and/or the interconnect integrated device(s).

The substrate 202 includes a first surface (e.g., top surface) and a second surface (e.g., bottom surface). The substrate 202 includes at least one dielectric layer 220, a plurality of interconnects 222, a first solder resist layer 224, and a second solder resist layer 226. The substrate 202 also includes a cavity 209 that extends through the substrate 202. The cavity 209 may extend through the at least one dielectric layer 220, the first solder resist layer 224 and the second solder resist layer 226. The cavity 209 may have any shape (e.g., rectangular, square). The cavity 209 may have lateral dimensions that are bigger than the lateral dimensions of the interconnect integrated device 201. The substrate 202 may include more than one cavity 209.

The plurality of interconnects 222 may be configured to provide at least one electrical path to and/or from a board. The plurality of interconnects 222 may be configured to provide at least one electrical path to at least one integrated device (e.g., 204, 206). The plurality of interconnects 222 may be configured to provide at least one electrical path (e.g., electrical connection) between two or more integrated devices (e.g., 204, 206). The plurality of interconnects 222 may have a first minimum pitch and a first minimum line and spacing (L/S). In some implementations, the first minimum line and spacing (L/S) for the plurality of interconnects 222 is in a range of approximately 9/9-12/12 micrometers (μm) (e.g., minimum line width of approximately 9-12 micrometers (μm), minimum spacing of approximately 9-12 micrometers (μm)). Different implementations may use different substrates. The substrate 202 may be a laminate substrate, a coreless substrate, an organic substrate, and/or a cored substrate (e.g., includes a core layer). In some implementations, the at least one dielectric layer 220 may include a core layer and/or prepreg layers. The at least one dielectric layer 220 may have a dielectric constant in a range of approximately 3.5-3.7. An example of fabricating a substrate is further described below in FIGS. 15A-15C. As will be further described below, in some implementations, the substrate 202 may be fabricated using a modified semi-additive process (mSAP) or a semi-additive process (SAP).

The first integrated device 204 is coupled to the first surface (e.g., top surface) of the substrate 202. In some implementations, the first integrated device 204 is coupled to the substrate 202 through a plurality of pillar interconnects 240 and/or a plurality of solder interconnects 242. The plurality of pillar interconnects 240 and/or the plurality of solder interconnects 242 may be coupled to the plurality of interconnects 222 of the substrate 202. Part of the first integrated device 204 may be located over the cavity 209. A front side of the first integrated device 204 may face the substrate 202.

The second integrated device 206 is coupled to the first surface of the substrate 202. In some implementations, the second integrated device 206 is coupled to the substrate 202 through a plurality of pillar interconnects 260 and/or a plurality of solder interconnects 262. The plurality of pillar interconnects 260 and/or the plurality of solder interconnects 262 may be coupled to the plurality of interconnects 222. Part of the second integrated device 206 may be located over the cavity 209. A front side of the second integrated device 206 may face the substrate 202.

The interconnect integrated device 201 is coupled to the first integrated device 204 and the second integrated device 206 through a plurality of pillar interconnects 230 and/or a plurality of solder interconnects 232. For example, a first plurality of pillar interconnects 230a and/or a first plurality of solder interconnects 232a may be used to couple the interconnect integrated device 201 to the first integrated device 204. A second plurality of pillar interconnects 230b and/or a second plurality of solder interconnects 232b may be used to couple the interconnect integrated device 201 to the second integrated device 206. A front side of the interconnect integrated device 201 may face the front side of the first integrated device 204 and the front side of the second integrated device 206. The interconnect integrated device 201 is located over the cavity 209 of the substrate 202. In some implementations, the interconnect integrated device 201 may be located at least partially in the cavity 209. In some implementations, the interconnect integrated device 201 may be located completely in the cavity 209 of the substrate 202. The cavity 209 may create a space for the interconnect integrated device 201 to fit underneath the first integrated device 204 and/or the second integrated device 206. Also, the use of the pillar interconnects may help provide space so that the interconnect integrated device 201 may fit underneath the first integrated device 204 and/or the second integrated device 206.

The interconnect integrated device 201 may be a high-density interconnect integrated device that includes interconnects with a second minimum pitch and a second minimum line and spacing (L/S). In some implementations, the second minimum line and spacing (L/S) for interconnects of the interconnect integrated device (e.g., 201) is in a range of approximately 2/2-5/5 micrometers (μm) (e.g., minimum line width of approximately 2-5 micrometers (μm), minimum spacing of approximately 2-5 micrometers (μm)). A pitch may be defined as a center to center distance between two adjacent interconnects. The second minimum line and spacing (L/S) for interconnects of the interconnect integrated device 201 is lower than the minimum line and spacing for interconnects of the substrate 202. The interconnect integrated device (e.g., 201) is a localized integrated device configured to be placed in a region near an integrated device. The size of the interconnect integrated device may vary with different implementations.

The interconnect integrated device 201, which has higher density interconnects, allows the package 200 to provide higher I/O pin counts, without having to increase the size of the package 200. For example, using the interconnect integrated device 201 may allow the substrate 202 to have a lower number of metal layers, which may help reduce the overall height of the package 200. The one or more interconnect integrated devices 201 may help reduce congestion and/or entanglement in certain regions (e.g., regions near an integrated device) of the substrate 202 due to the high number of pin count and/or number of netlists. The interconnect integrated device 201 may have a lower height than the first integrated devices 204 and/or the second integrated device 206. Providing at least one electrical path between integrate devices that bypasses the substrate 202 may help improve the performance of the package 200, by reducing routing congestion in the substrate 202, and/or by reducing the paths for currents (e.g., signals) between the integrated devices. The end result, is a package improved electrical performances and a more compact form factor. In addition, the interconnect integrated device 201 may help lower the cost of the substrate 202 because the interconnects of the substrate 202 do not need to be as close together (e.g., lower L/S) to achieve near die break-out, since the interconnects of the interconnect integrated device 201 will help with the near die break-out. As will be further described below, an interconnect integrated device (e.g., 201) may be configured as a bridge. An interconnect integrated device (e.g., 201) may include a die (e.g., passive device die, bridge die). An interconnect integrated device that is configured as a bridge die and/or a passive device die may be free of active devices, such as transistors.

As shown in FIG. 2, the underfill 208 is located (i) between the first integrated device 204 and the substrate 202, (ii) between the second integrated device 206 and the substrate 202, (iii) between the interconnect integrated device 201 and the first integrated device 204, and (iv) between the interconnect integrated device 201 and the second integrated device 206. The underfill 208 may be located laterally to the interconnect integrated device 201. For example, the underfill 208 may laterally surround the interconnect integrated device 201. The underfill 208 may surround the plurality of pillar interconnects (e.g., 230, 240, 260) and/or the plurality of solder interconnects (e.g., 232, 242, 262). As will be further described below, the underfill 208 may be located in other places, such as in the cavity 209 and/or over the first integrated device 204 and the second integrated device 206.

The underfill 208 helps provide structural stability to the package 200. In particular, the underfill 208 helps provide a strong and reliable mechanical coupling between the interconnect integrated device 201, the first integrated device 204 and the second integrated device 206. By helping to keep the interconnect integrated device 201, the first integrated device 204 and the second integrated device 206 structurally together, the underfill 208 helps ensure that a strong and reliable electrical connection (e.g., electrical path) exist between the first integrated device 204 and the second integrated device 206.

Different implementations may provide the underfill 208 with different materials and/or properties. The underfill 208 may include one or more underfill (e.g., underfill layers). For example, the underfill 208 may be formed from a single formation of an underfill. In some implementations, the underfill 208 may represent several portions and/or layers of underfills that are formed and cured separately. In some implementations, the underfill 208 may include a viscosity of approximately 10-30 pascal second. (Pa·s). These viscosity values may be for temperatures of about 80 degrees Celsius. In some implementations, the underfill 208 may include a coefficient of thermal expansion (CTE) of approximately 10-15 part per million (ppm). In some implementations, the underfill 208 may include a filler that represents approximately 50-90 percent of the weight of the underfill 208. As will be further described below, the underfill 208 may have capillary properties that allow the underfill 208 to fill small spaces between the integrated devices and/or the substrate. For example, the viscosity values described above for the underfill 208 allows the underfill 208 to travel and fill between the small spaces between the integrated devices and/or the substrate. The underfill 208 and/or other materials that may be located around the pillars and between the integrated device and a substrate are further described below.

An integrated device (e.g., 204, 206) may include a die (e.g., semiconductor bare die). The integrated device may include a logic die, a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 204, 206) may include at least one electronic circuit (e.g., first electronic circuit, second electronic circuit, etc. . . . ).

FIG. 2 illustrates that the interconnect integrated device 201 includes at least one dielectric layer 210, a plurality of interconnects 212, a passivation layer 214 and a substrate 216. The substrate 216 may include silicon (Si), glass, or quartz. The substrate 216 may be a die substrate. The interconnect integrated device 201 may include a front side and a back side. The back side of the interconnect integrated device 201 may be the side that includes the substrate 216.

The front side of the interconnect integrated device 201 may be the side that includes the passivation layer 214 and/or the side to which the solder interconnect is coupled to the interconnect integrated device 201. The front side of the interconnect integrated device 201 may be opposite to the back side of the interconnect integrated device 201. As will be further described below, the interconnect integrated device 201 (and/or any of the interconnect integrated device described in the disclosure) may be configured as a bridge. The interconnect integrated device 201 may include a die (e.g., passive device die, bridge die). An interconnect integrated device that is configured as a bridge and/or a passive device die may be free of active devices, such as transistors. Thus, an interconnect integrated device that is configured as a bridge and/or a passive device die may be free of a transistor (e.g., free of a transistor that is coupled to a circuit). As mentioned above, the interconnects of the interconnect integrated device may have higher density (e.g., lower minimum pitch and/or lower minimum L/S) than the interconnects of the substrate 202. The passivation layer 214 is located over a first surface of the interconnect integrated device 201. The plurality of pillar interconnects 230 is coupled to the first surface of the interconnect integrated device 201. However, in some implementations, the plurality of solder interconnects 232 may be coupled to the first surface of the interconnect integrated device 201.

Figure 3:
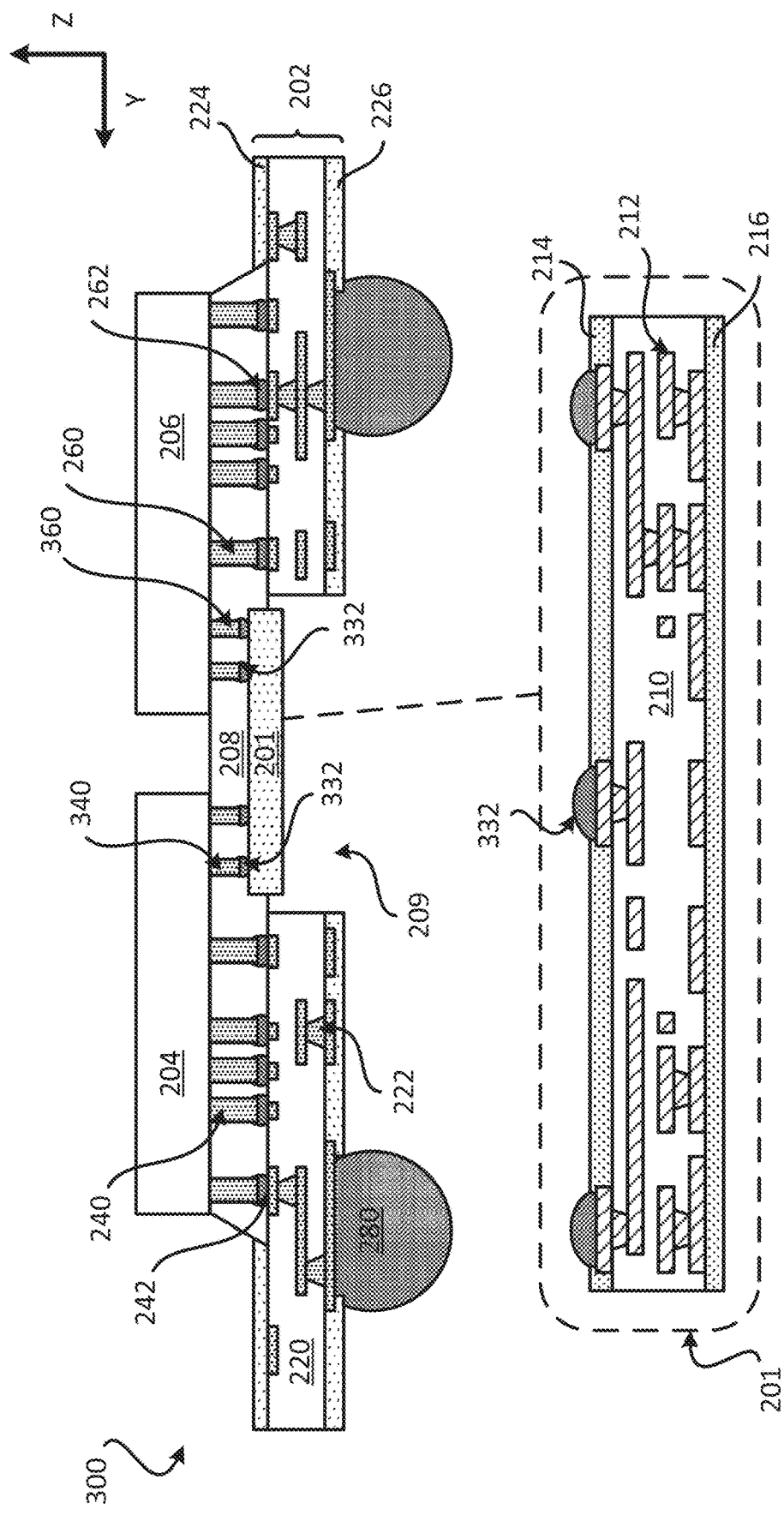
FIG. 3 illustrates a profile view of another package that includes a high-density interconnect integrated device.

FIG. 3 illustrates a package 300 that includes an interconnect integrated device. The package 300 is similar to the package 200 of FIG. 2, and thus includes the same or similar components as the package 200. As shown in FIG. 3, the interconnect integrated device 201 is coupled to the first integrated device 204 and the second integrated device 206 differently.

The interconnect integrated device 201 is coupled to the plurality of solder interconnects 332. The plurality of solder interconnects 332 is coupled to the plurality of pillar interconnects 340 and 360. Thus, the interconnect integrated device 201 is coupled to the first integrated device 204 through the plurality of solder interconnects 332 and the plurality of pillar interconnects 340. Similarly, the interconnect integrated device 201 is coupled to the second integrated device 206 through the plurality of solder interconnects 332 and the plurality of pillar interconnects 360.

As mentioned above, an interconnect integrated device may be a component that is coupled to the substrate 202, so that the package (e.g., 200, 300) may provide higher I/O pin counts without having to increase the overall size of the package and/or may provide shorter paths between integrated devices. In some implementations, one or more electrical signals to and from one or more integrated devices may travel through one or more interconnect integrated devices. The one or more interconnect integrated devices (e.g., 201) may help reduce congestion and/or entanglement in certain areas of the substrate due to the high number of pin count and/or number of netlists. A netlist is an arrangement of components of a circuit and how the components are electrically coupled together. The one or more interconnect integrated device 201 provides shorter paths between integrated devices, helps lower inductance, and/or reduces routing constraints. The underfill 208 helps provide structural stability for the package, such as structural stability between the interconnect integrated device 201 and the integrated devices (e.g., 204, 206).

Figure 4:
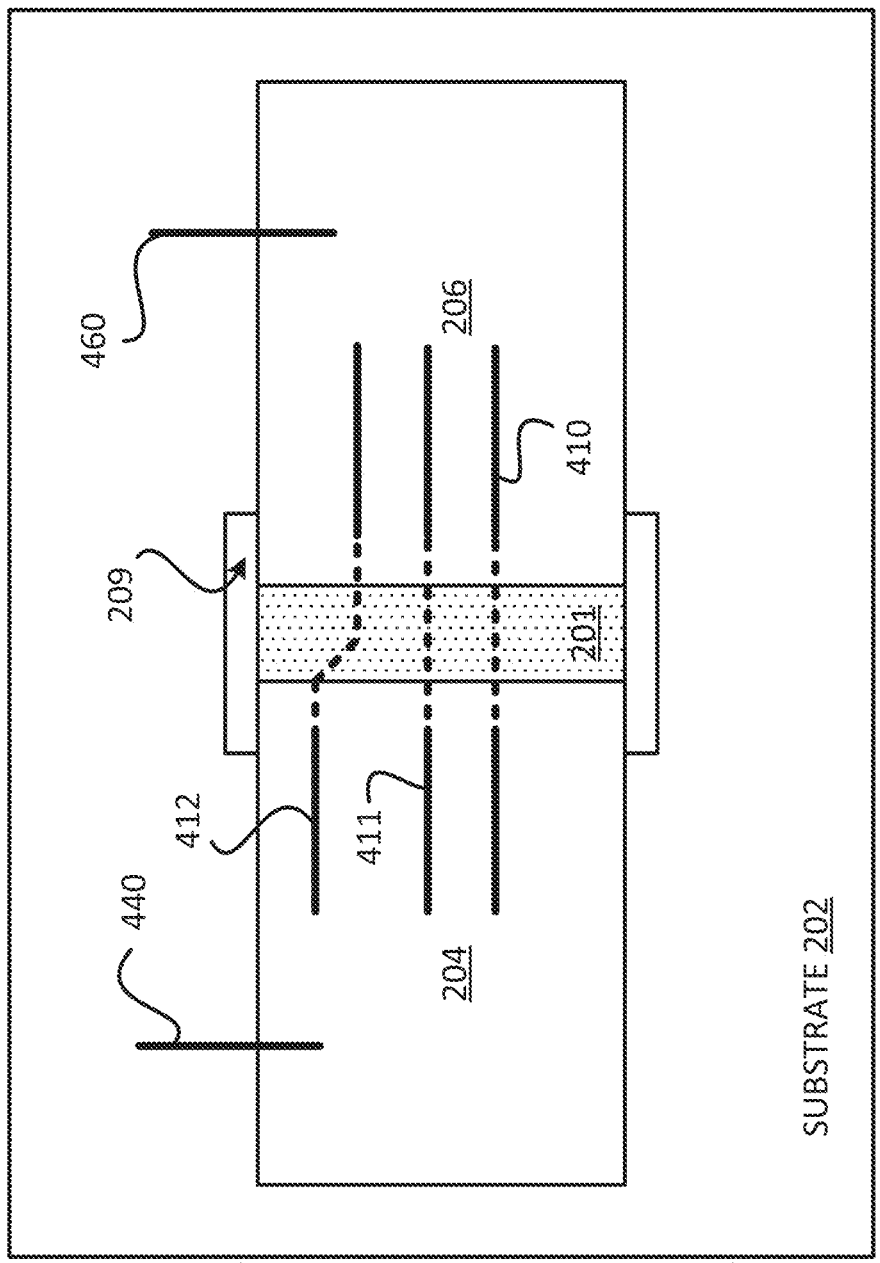
FIG. 4 illustrates a view of possible electrical paths in a package that includes a high-density interconnect integrated device coupled to a substrate.

FIG. 4 illustrates a view of how electrical signals may conceptually be configured to travel in a package. FIG. 4 illustrates a package 400 that includes the interconnect integrated device 201, the substrate 202, the first integrated device 204 and the second integrated device 206. The package 400 may conceptually represent any of the packages described in the disclosure. FIG. 4 illustrates (i) a first electrical path 410 for a first electrical signal, (ii) a second electrical path 411 for a second electrical signal, (iii) a third electrical path 412 for a third electrical signal, (iv) a fourth electrical path 440 for a fourth electrical signal, and (v) a fifth electrical path 460 for a fifth electrical signal.

The first electrical path 410, the second electrical path 411 and the third electrical path 412 illustrate examples of electrical paths between integrated devices that bypass or skip interconnects from the substrate 202. The first electrical path 410 may be configured to allow at least one signal to travel between the first integrated device 204 and the second integrated device 206 through the interconnect integrated device 201. The second electrical path 411 may be configured to allow at least one signal to travel between the first integrated device 204 and the second integrated device 206 through the interconnect integrated device 201. The third electrical path 412 may be configured to allow at least one signal to travel between the first integrated device 204 and the second integrated device 206 through the interconnect integrated device 201. For example, one of more of the electrical paths (e.g., 410, 411, 412) between integrated devices may be defined to include the first plurality of solder interconnects (e.g., 232a, 332), the first plurality of pillar interconnects (e.g., 230a, 340), the plurality of interconnects 212, the second plurality of pillar interconnects (e.g., 230b, 360), and/or the second plurality of solder interconnects (e.g., 232b, 332).

The fourth electrical path 440 may be configured to allow at least one signal to travel between the first integrated device 204 and the substrate 202. The fourth electrical path 440 may be defined to include the plurality of pillar interconnects 240 and/or the plurality of solder interconnects 242. The fifth electrical path 460 may be configured to allow at least one signal to travel between the second integrated device 206 and the substrate 202. The fifth electrical path 460 may be defined to include the plurality of pillar interconnects 260 and/or the plurality of solder interconnects 262. It is noted that two or more of the various electrical paths described in the disclosure may be configured to be electrically coupled to each other. An electrical signal may include I/O signals. Instead of I/O signals, the exemplary paths shown in the disclosure may be applicable to power and/or ground as well.

Figure 5:
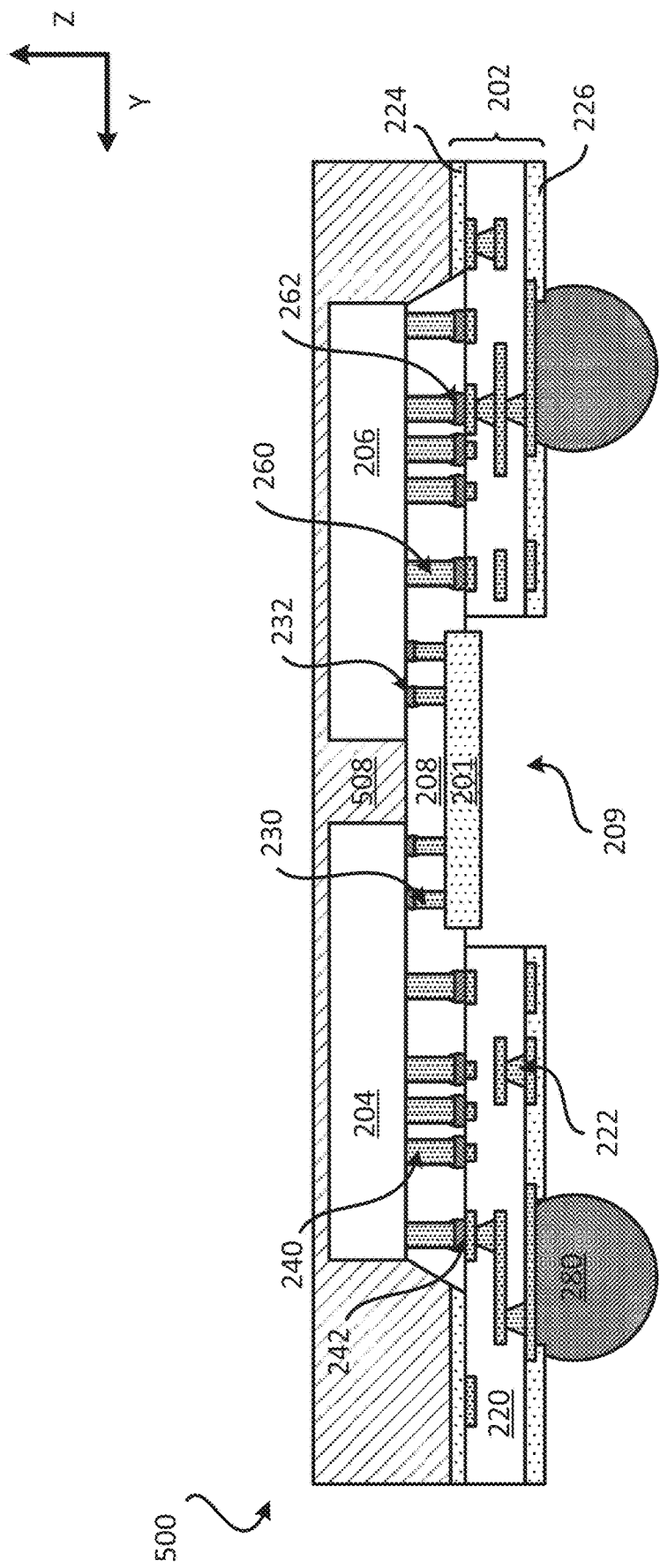
FIG. 5 illustrates a profile view of another package that includes a high-density interconnect integrated device.

FIG. 5 illustrates a package 500 that includes an interconnect integrated device. The package 500 is similar to the package 200 of FIG. 2, and thus includes the same or similar components as the package 200. As shown in FIG. 5, the package 500 also includes an encapsulation layer 508. The encapsulation layer 508 is located over the first surface (e.g., top surface) of the substrate 202 such that the encapsulation layer 508 encapsulates the first integrated device 204 and the second integrated device 206. The encapsulation layer 508 may be located over the back side of the first integrated device 204 and the back side of the second integrated device 206. The encapsulation layer 508 may surround the underfill 208. The encapsulation layer 508 may include a mold, a resin, an epoxy and/or polymer. The encapsulation layer 508 may be a means for encapsulation. The encapsulation layer 508 may provide additional structural strength to the package, helping provide a strong and reliable mechanical coupling between the first integrated device 204, the second integrated device 206 and the interconnect integrated device 201. It is noted that the encapsulation layer 508 may optionally be located in the cavity 209.

Figure 6:
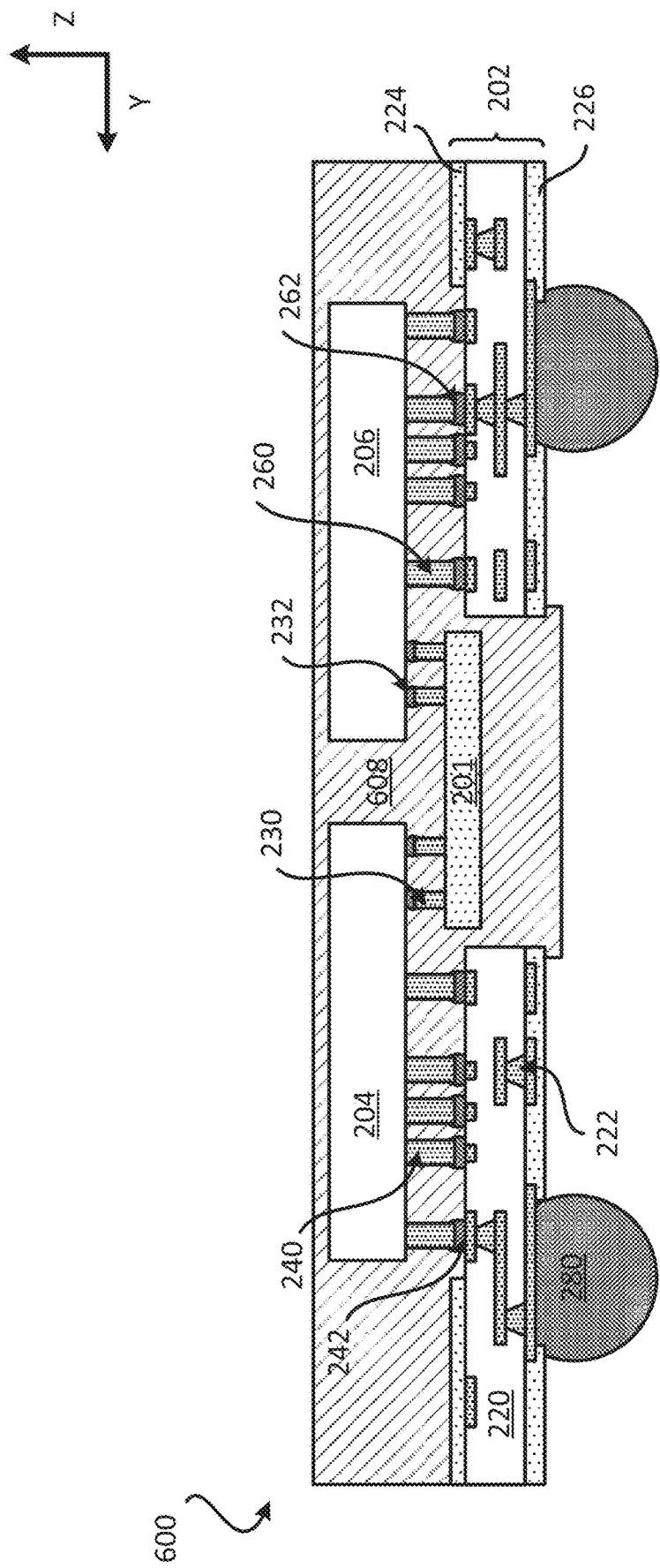
FIG. 6 illustrates a profile view of another package that includes a high-density interconnect integrated device.

FIG. 6 illustrates a package 600 that includes an interconnect integrated device. The package 600 is similar to the package 200 of FIG. 2, and thus includes the same or similar components as the package 200. As shown in FIG. 6, the package 600 includes an encapsulation layer 608. The encapsulation layer 608 is located (i) between the first integrated device 204 and the substrate 202, (ii) between the second integrated device 206 and the substrate 202, (iii) between the interconnect integrated device 201 and the first integrated device 204, and (iv) between the interconnect integrated device 201 and the second integrated device 206. The encapsulation layer 608 may be located laterally to the interconnect integrated device 201. For example, the encapsulation layer 608 may laterally surround the interconnect integrated device 201. The encapsulation layer 608 may surround the plurality of pillar interconnects (e.g., 230, 240, 260) and/or the plurality of solder interconnects (e.g., 232, 242, 262). The encapsulation layer 608 may replace the functionally of the underfill 208 of FIG. 2. The encapsulation layer 608 is located over the first surface (e.g., top surface) of the substrate 202 such that the encapsulation layer 608 encapsulates the first integrated device 204 and the second integrated device 206. The encapsulation layer 608 may be located over the back side of the first integrated device 204 and the back side of the second integrated device 206. The encapsulation layer 608 may be located in the cavity 209 of the substrate 202. The encapsulation layer 608 may extend beyond the bottom surface of the substrate 202. Providing the encapsulation layer 608 for the entire package may be more cost effective than providing an underfill and an encapsulation layer for the package. The encapsulation layer 608 may be the same, similar or different than the encapsulation layer 508. The encapsulation layer 608 may include a mold underfill (MUF).

As mentioned above, the underfill 208, the encapsulation layer 508 and/or the encapsulation layer 608, may have specific properties to ensure that the space around the pillar interconnects and the space between an integrated device and a substrate is properly filled to ensure a strong and secure bond between integrated devices and the substrate.

For example, the underfill 208 may include a capillary underfill that has good flowing ability. A capillary underfill may include (CUF) a polymer composite material of silica particle and epoxy liquid. One property of the capillary underfill is good flowing ability upon heating so it can flow into the narrow space between the integrated device and the substrate, which is driven by capillary force. The capillary underfill may have enough silica filler to get a final cured material with a low CTE. The capillary underfill may be a liquid type usually frozen under −40 degrees Celsius, and thawed and heated before application.

The encapsulation layer 508 may include an encapsulation material and/or epoxy mold compound (EMC) that is used to cover the whole package after capillary underfill application so it can protect the whole package. The encapsulation layer 508 may include solid pellet which can be stored at room temperature. The encapsulation layer 508 can be heated to liquid and process under the transfer molding flow to cover the integrated device.

In some implementations, a mold underfill (MUF) may be used instead of, or in conjunction with the underfill 208 and/or the encapsulation layer 508. A mold underfill may be a combination of a capillary underfill (e.g., underfill 208) and an EMC (e.g., encapsulation layer 508). The material properties and application format of the mold underfill are same or similar as regular EMC but with much finer filler size so it can be pressed into the integrated device to substrate gap during transfer molding process. By this way, the mold underfill can replace capillary underfill, and reduce the process steps.

The EMC and the MUF can have much higher filler loading up to 90 weight (wt) % so the cured material properties is better than the capillary underfill with lower CTE and high modulus. In some implementations, if a package needs an encapsulation layer, the MUF may be used to replace the CUF. For package without an encapsulation layer, only the CUF may be used. Table 1 below illustrates exemplary properties of various materials, underfills and encapsulation layers. It is noted that the values for the materials are exemplary. Different materials may have different properties. Moreover, the values shown in the Table 1 are not limiting.

TABLE 1

Exemplary Properties of various materials, underfills and/or encapsulation layers.

| | CAPILLARY UNDERFILL (CUF) | EPOXY MOLD COMPOUND (EMC) | MOLD UNDERFILL (MUF) | POLYIMIDE (PI) or PBO DIELECTRIC FILM |
|---|---|---|---|---|
| Filler loading | 50~70 wt % | Up to 90 wt % | Up to 90 wt % | 0% |
| Filler size | 0.1~3 um | Top cut up to 100 um | Top cut 20 um | N/A |
| Format before curing | Liquid | Solid | solid | liquid |
| Curing temp. | 150 C. | 180 C. | 180 C. | 250-390 C. |
| Cured material glass transition temp. | 120~150 C. | 150~160 C. | 150~160 C. | 250~320 C. |
| Cured material modulus | 5~10 GPa | 12-20 GPa | 12-20 GPa | 2~3 GPa |
| Cured material CTE | 20~30 ppm/C. | 1~5 ppm/C. | 1~5 ppm/C. | 30-80 |

It is noted that encapsulation layer 508 may be applicable to the package 300 of FIG. 3, or any package described in the disclosure. As mentioned above, a package may include two or more integrated devices. For example, a package may include four integrated devices arranged in a 2×2 array.

Figure 7:
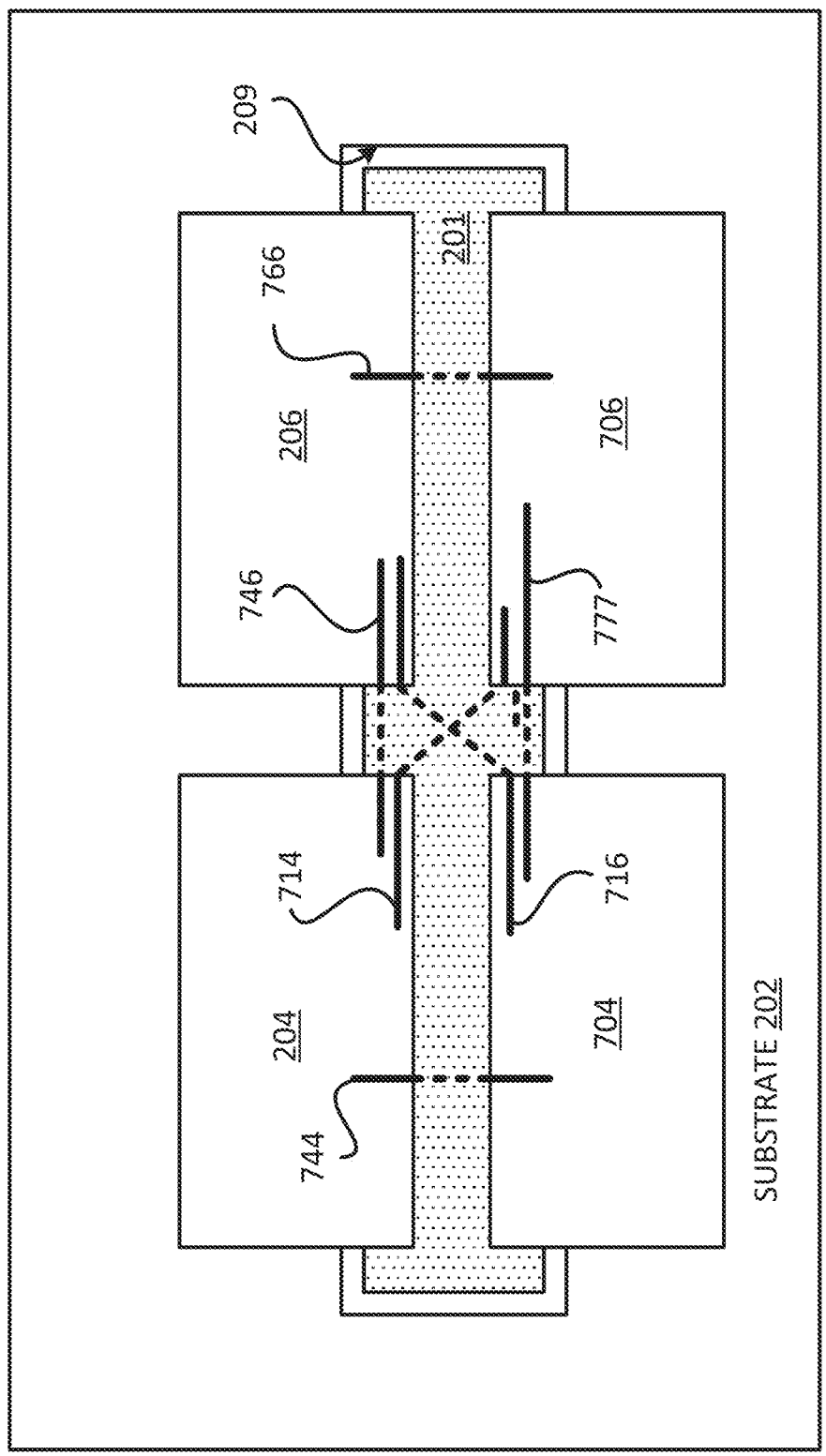
FIG. 7 illustrates a view of possible electrical paths in a package that includes a high-density interconnect integrated device.

FIG. 7 illustrates a package 700 that includes the substrate 202, the integrated device 201, the first integrated device 204, the second integrated device 206, a third integrated device 704, and a fourth integrated device 706. The first integrated device 204, the second integrated device 206, the third integrated device 704, and the fourth integrated device 706 may be coupled to a first surface of the substrate 202. The first integrated device 204, the second integrated device 206, the third integrated device 704, and the fourth integrated device 706 may be arranged in a 2×2 array. The spacing between integrated devices may be in a range of approximately 0.1-1.5 millimeters (mm) A plurality of solder interconnects and/or a plurality of pillar interconnects, as described in at least FIGS. 2 and 3 may be used to couple each integrated device to the substrate 202. The package 700 may be similar to the packages 200, 300, 500 and/or 600, and thus may include similar or the same components as the packages 200, 300, 500 and/or 600. The substrate 202 includes the cavity 209. A portion of each of the integrated device may be located over the cavity 209.

The integrated devices may be configured to be electrically coupled to each other through the interconnect integrated device 201. FIG. 7 illustrates (i) a first electrical path 714 for a first electrical signal, (ii) a second electrical path 716 for a second electrical signal, (iii) a third electrical path 744 for a third electrical signal, (iv) a fourth electrical path 746 for a fourth electrical signal, (v) a fifth electrical path 766 for a fifth electrical signal, and (vi) a sixth electrical path 777 for a sixth electrical signal. The first electrical path 714, the second electrical path 716, the third electrical path 744, the fourth electrical path 746, the fifth electrical path 766 and the sixth electrical path 777 illustrate examples of electrical paths between integrated devices that bypass or skip interconnects from the substrate 202.

The first electrical path 714 may be configured to allow at least one signal to travel between the first integrated device 204 and the fourth integrated device 706 through the interconnect integrated device 201. The second electrical path 716 may be configured to allow at least one signal to travel between the third integrated device 704 and the second integrated device 206 through the interconnect integrated device 201. The third electrical path 744 may be configured to allow at least one signal to travel between the first integrated device 204 and the third integrated device 704 through the interconnect integrated device 201. The fourth electrical path 746 may be configured to allow at least one signal to travel between the first integrated device 204 and the second integrated device 206 through the interconnect integrated device 201. The fifth electrical path 766 may be configured to allow at least one signal to travel between the second integrated device 206 and the fourth integrated device 706 through the interconnect integrated device 201. The sixth electrical path 777 may be configured to allow at least one signal to travel between the third integrated device 704 and the fourth integrated device 706 through the interconnect integrated device 201.

It is noted that each of the integrated devices may include additional electrical paths between each other and/or the substrate 202. It is noted that the paths of the electrical signals shown in the disclosure are exemplary and/or conceptual. Different implementations may use different paths for the electrical signals. Moreover, electrical signals and/or electrical paths may travel through different types of interconnects (e.g., vias, traces, pads, pillars), solder interconnects and/or components (e.g., passive devices). Thus, for example, in some implementations, an electrical signal traveling between an integrated device and an interconnect integrated device may travel through at least one intervening component (e.g., passive device, capacitor) between the integrated device and the interconnect integrated device. The paths shown for the electrical signals may also be applied to power and/or ground. It is also noted that more than one interconnect integrated device may be used to facilitate the bypassing of the substrate. The terms "first surface" and "second surface" of a substrate are arbitrary, and may mean any surface of the substrate. For example, the first surface of the substrate may be a bottom surface of the substrate, and the second surface of the substrate may be a top surface of the substrate. In another example, the first surface of the substrate may be a top surface of the substrate, and the second surface of the substrate may be a bottom surface of the substrate. An interconnect integrated device (e.g., 201) may be a means for integrated device interconnection. An example of a method for fabricating an interconnect integrated device is illustrated and described below in FIGS. 8A-8D.

Exemplary Sequence for Fabricating a High-Density Interconnect Integrated Device FIGS. 8A-8D illustrate an exemplary sequence for providing or fabricating a high-density interconnect integrated device. In some implementations, the sequence of FIGS. 8A-8D may be used to provide or fabricate the interconnect integrated device 201 of FIG. 2, or any of the interconnect integrated device described in the disclosure.

It should be noted that the sequence of FIGS. 8A-8D may combine one or more stages in order to simplify and/or clarify the sequence for providing or fabricating the interconnect integrated device. In some implementations, the order of the processes may be changed or modified. In some implementations, one or more of processes may be replaced or substituted without departing from the scope of the disclosure. Different implementations may fabricate an interconnect integrated device differently.

Figure 8A:
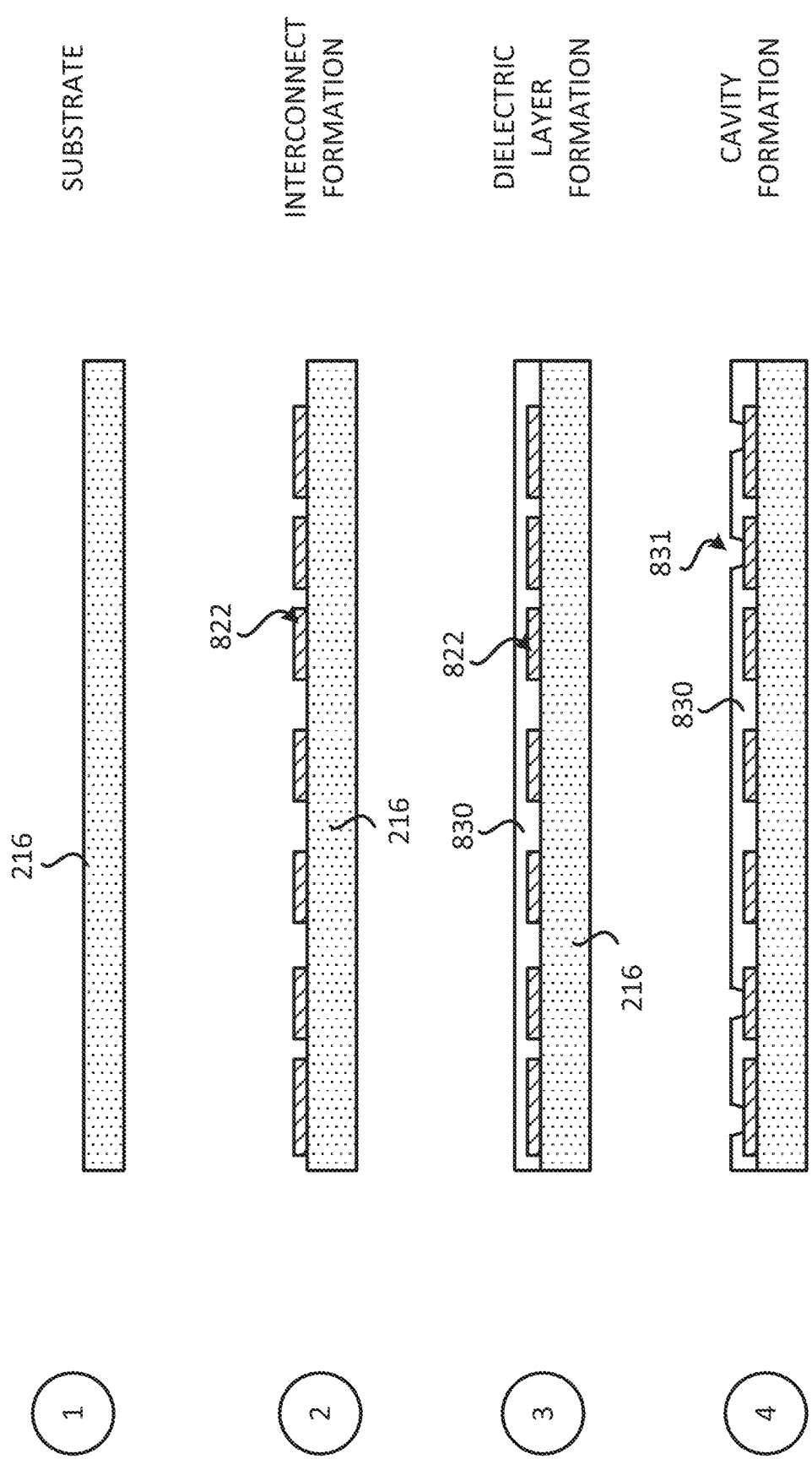
FIGS. 8A-8D illustrate an exemplary sequence for fabricating a high-density interconnect integrated device.

Stage 1, as shown in FIG. 8A, illustrates a state after a substrate 216 is provided. The substrate 216 may include glass, quartz and/or silicon.

Stage 2 illustrates a state after a plurality of interconnects 822 is formed over the substrate 216. The plurality of interconnects 822 may include traces and/or pads. Forming the plurality of interconnects 822 may include forming a seed layer, performing a lithography process, a plating process, a stripping process and/or an etching process. The plurality of interconnects 822 may be part of the plurality of interconnects 212.

Stage 3 illustrates a state after the dielectric layer 830 is formed over the plurality of interconnects 822 and the substrate 216. The dielectric layer 830 may be deposited and/or coated over the plurality of interconnects 822 and the dielectric layer 820. The dielectric layer 830 may include polymer. The dielectric layer 830 may be similar to the dielectric layer 210.

Stage 4 illustrates a state after cavities 831 are formed in the dielectric layer 830. An etching process may be used to form the cavities 831.

Figure 8B:
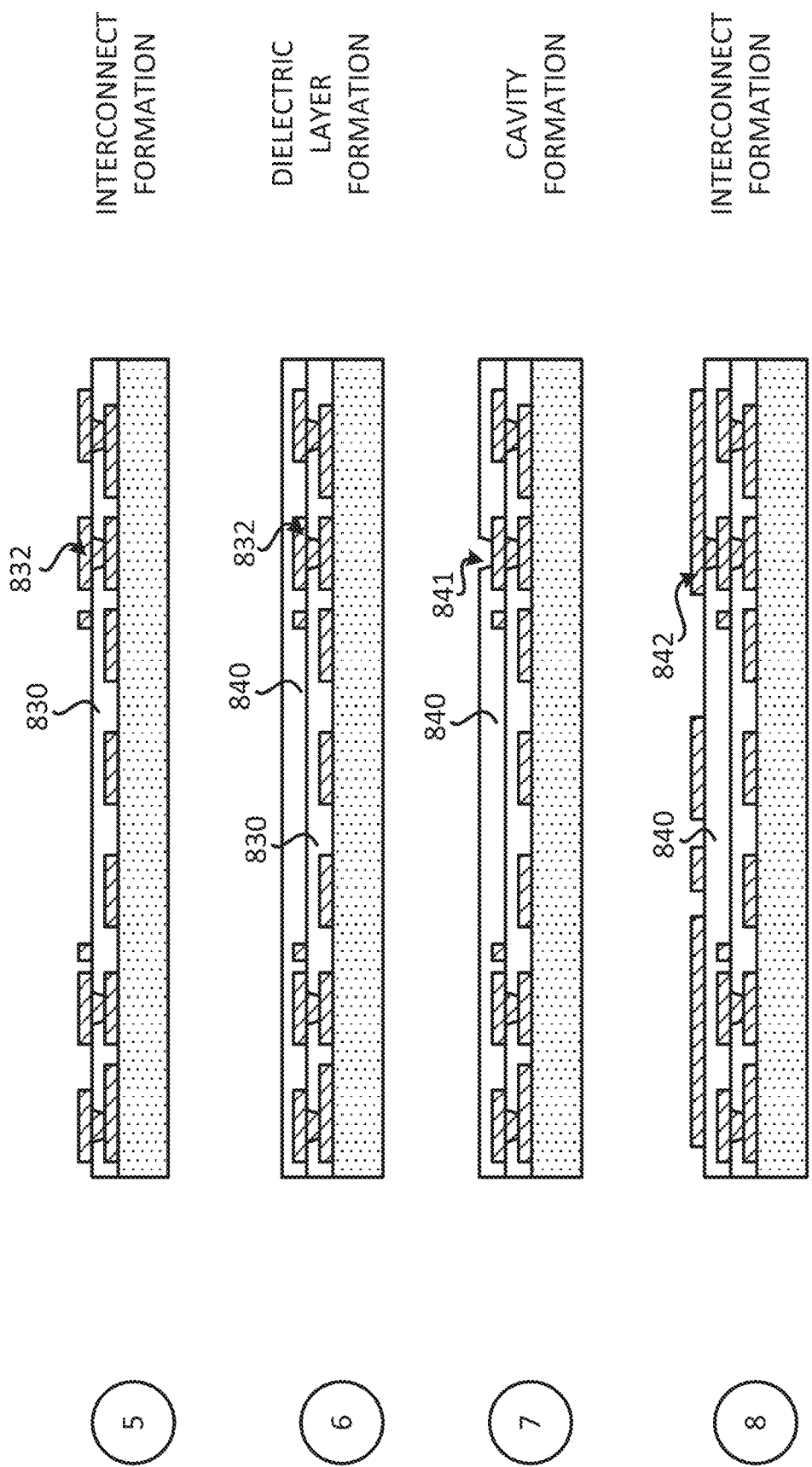

Stage 5, as shown in FIG. 8B, illustrates a state after a plurality of interconnects 832 is formed over the dielectric layer 830. The plurality of interconnects 832 may include vias, traces and/or pads. Forming the plurality of interconnects 832 may include performing a lithography process, a plating process, a stripping process and/or an etching process. The plurality of interconnects 832 may be part of the plurality of interconnects 212.

Stage 6 illustrates a state after the dielectric layer 840 is formed over the plurality of interconnects 832 and the dielectric layer 830. The dielectric layer 840 may be deposited and/or coated over the plurality of interconnects 832 and the dielectric layer 830. The dielectric layer 840 may include polymer. The dielectric layer 840 may be similar to the dielectric layer 830.

Stage 7 illustrates a state after cavities 841 are formed in the dielectric layer 840. An etching process may be used to form the cavities 841.

Stage 8 illustrates a state after a plurality of interconnects 842 is formed over the dielectric layer 840. The plurality of interconnects 842 may include vias, traces and/or pads. Forming the plurality of interconnects 842 may include performing a lithography process, a plating process, a stripping process and/or an etching process. The plurality of interconnects 842 may be part of the plurality of interconnects 212.

Figure 8C:
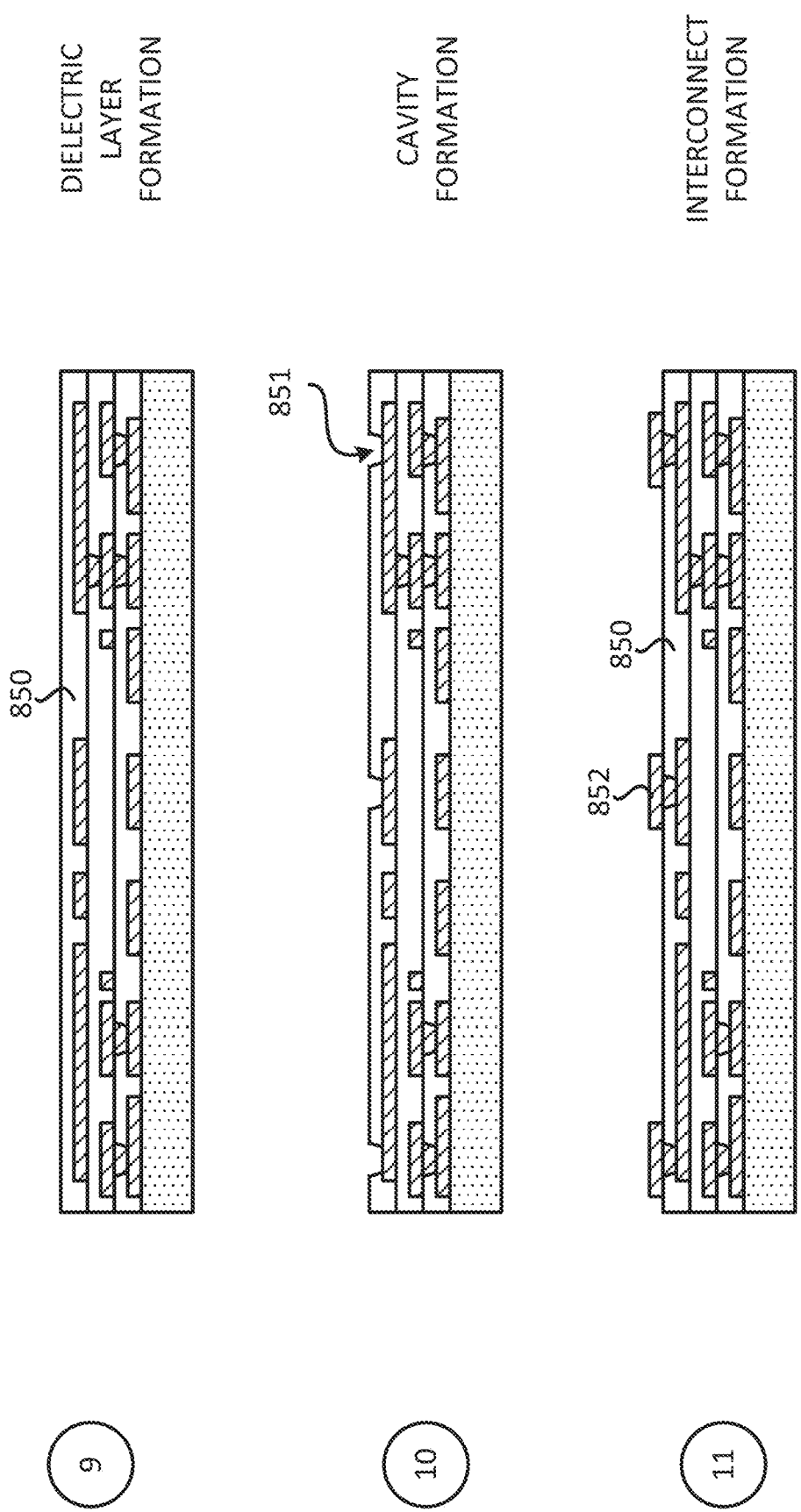

Stage 9, as shown in FIG. 8C, illustrates a state after the dielectric layer 850 is formed over the plurality of interconnects 842 and the dielectric layer 840. The dielectric layer 850 may be deposited and/or coated over the plurality of interconnects 842 and the dielectric layer 840. The dielectric layer 850 may include polymer. The dielectric layer 850 may be similar to the dielectric layer 840.

Stage 10 illustrates a state after cavities 851 are formed in the dielectric layer 850. An etching process may be used to form the cavities 851. The cavities 851 may expose portions of the plurality of interconnects 842.

Stage 11 illustrates a state after a plurality of interconnects 852 is formed over the dielectric layer 850. The plurality of interconnects 852 may include vias, traces and/or pads. Forming the plurality of interconnects 852 may include performing a lithography process, a plating process, a stripping process and/or an etching process. The plurality of interconnects 852 may be part of the plurality of interconnects 212.

Figure 8D:
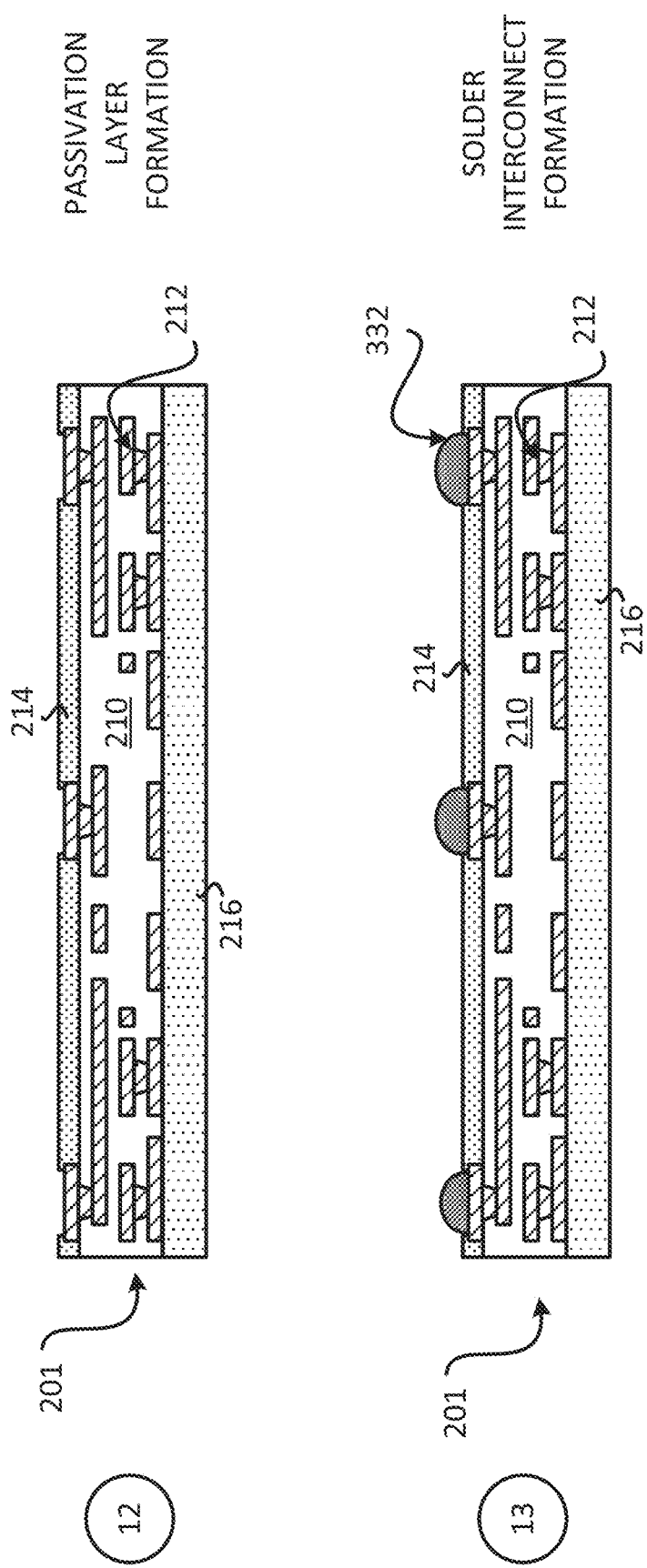

Stage 12, as shown in FIG. 8D, illustrates a state after the passivation layer 214 is formed over the at least one dielectric layer 210. A deposition process may be used to form the passivation layer 214. The at least one dielectric layer 210 may represent the dielectric layers 830, 840 and 850. Stage 12 may illustrate the plurality of interconnects 212, which may include the plurality of interconnects 832, 842 and/or 852.

Stage 13 illustrates a state after the plurality of solder interconnects 332 is coupled to the interconnect integrated device 201. Stage 13 may illustrate an example of the interconnect integrated device 201 as described in FIG. 2. In some implementations, the interconnect integrated device 201 is part of a wafer, and singulation may be performed to cut the wafer into individual interconnect integrated devices.

It is noted that pillars interconnects may be formed over interconnect integrated devices and the plurality of solder interconnects 332 may be coupled to the pillar interconnects. For example, pillar interconnects may be coupled to the plurality of interconnects 212, and the plurality of solder interconnects 332 may be coupled to the pillar interconnects. FIGS. 10-12 illustrate examples of how pillar interconnects may be formed over an interconnect integrated device.

Figure 9:
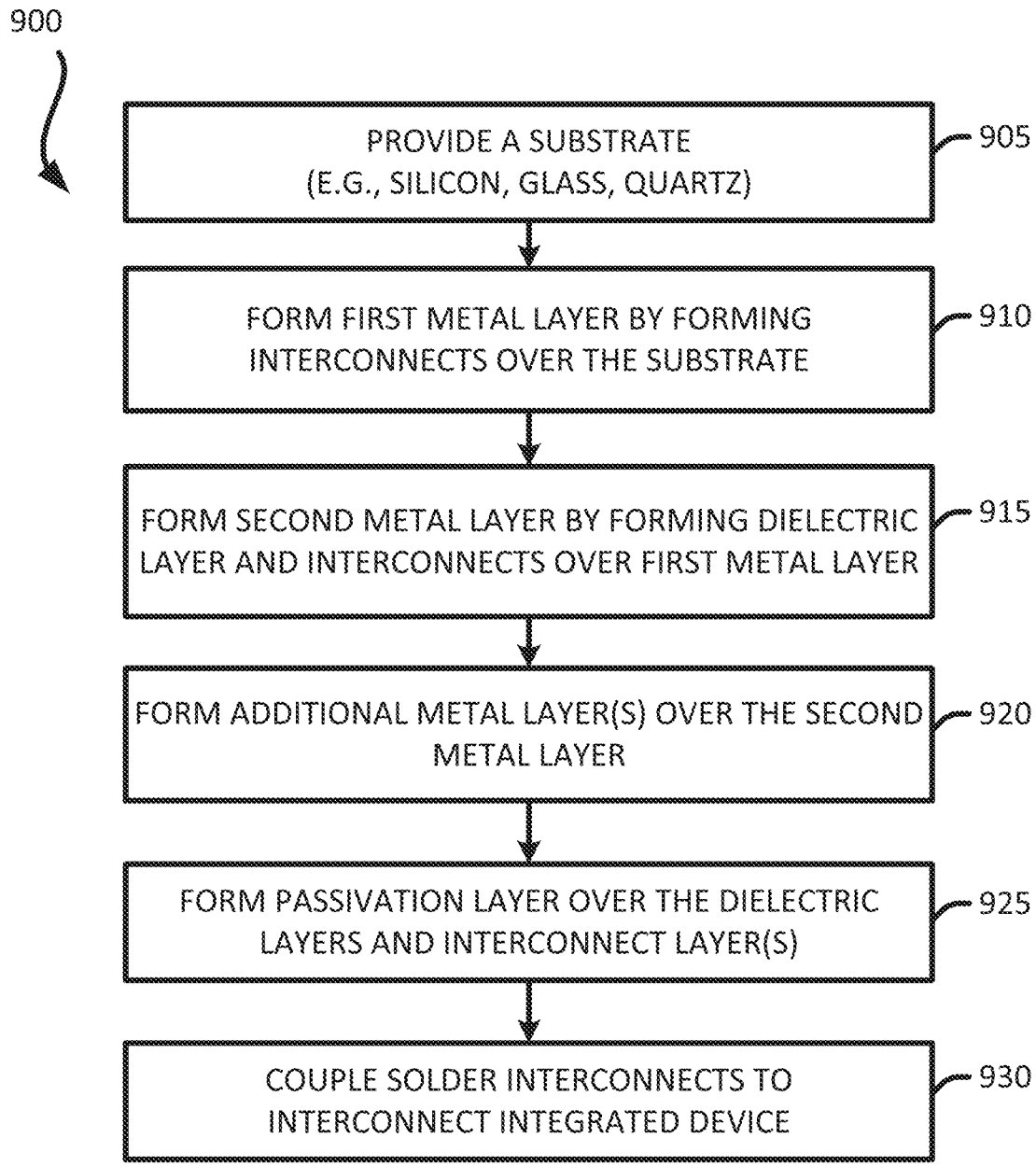
FIG. 9 illustrates an exemplary flow diagram of a method for fabricating a high-density interconnect integrated device.

Exemplary Flow Diagram of a Method for Fabricating a High-Density Interconnect Integrated Device In some implementations, fabricating a package that includes a high density interconnect integrated device includes several processes. FIG. 9 illustrates an exemplary flow diagram of a method 900 for providing or fabricating a high-density interconnect integrated device. In some implementations, the method 900 of FIG. 9 may be used to provide or fabricate the high-density interconnect integrated device (e.g., 201) of FIG. 2 described in the disclosure. However, the method 900 may be used to provide or fabricate any of the interconnect integrated devices described in the disclosure.

It should be noted that the method of FIG. 9 may combine one or more processes in order to simplify and/or clarify the method for providing or fabricating an interconnect integrated device. In some implementations, the order of the processes may be changed or modified.

The method provides (at 905) a substrate (e.g., 216). The substrate 216 may include glass, quartz and/or silicon. Stage 1 of FIG. 8A illustrates an example of a substrate.

The method forms (at 910) a first metal layer by forming a plurality of interconnects 822 over the substrate (e.g., 216). Forming the plurality of interconnects may include performing a lithography process, performing a plating process, performing a stripping process and/or performing an etching process. Stage 2 of FIG. 8A, illustrates an example of forming a first metal layer for a high-density interconnect integrated device.

The method forms (at 915) a second metal layer by forming a dielectric layer (e.g., 830) and a plurality of interconnects (e.g., 832) over the first metal layer. The dielectric layer may include a polymer. Forming the dielectric layer and the plurality of interconnects may include depositing a dielectric layer 830 over the dielectric layer 820 and the interconnects 822, performing a lithography process, performing a plating process, performing a stripping process and/or performing an etching process. Stages 3-5 of FIGS. 8A-8B, illustrate an example of forming a second metal layer (e.g., redistribution layer, redistribution metal layer) for a high-density interconnect integrated device. A redistribution layer (RDL) may be a form of a metallization layer. An RDL may include interconnects that include a U-shape or V-shape. The terms "U-shape" and "V-shape" shall be interchangeable. The terms "U-shape" and "V-shape" may refer to the side profile shape of the interconnects and/or redistribution interconnects. The U-shape interconnect and the V-shape interconnect may have a top portion and a bottom portion. A bottom portion of a U-shape interconnect (or a V-shape interconnect) may be coupled to a top portion of another U-shape interconnect (or a V-shape interconnect). Forming the metal layer and the dielectric layer may include using a back end of line (BEOL) process.

The method forms (at 920) additional metal layer(s) by forming one or more dielectric layers (e.g., 840, 850) and a plurality of interconnects (e.g., 842, 852) over the second metal layer. The dielectric layer may include a polymer. Forming the dielectric layer and the plurality of interconnects may include depositing one or more dielectric layers (e.g., 840, 850) over the dielectric layer 830 and the interconnects 832, performing a lithography process, performing a plating process, performing a stripping process and/or performing an etching process. Stages 7-11 of FIGS. 8B-8C, illustrate an example of forming additional metal layers for a high-density interconnect integrated device. Forming the additional metal layers and the additional dielectric layers may include using a back end of line (BEOL) process.

The method forms (at 925) a passivation layer (e.g., 214) over the dielectric layer of the interconnect integrated device (e.g., 201). The passivation layer (e.g., 214) may be deposited over the dielectric layer 210. Stage 12 of FIG. 8D, illustrates an example of a passivation layer formed over a dielectric layer of an interconnect integrated device. Stage 12 may illustrate an example of an interconnect integrated device (e.g., 201).

The method couples (at 930) a plurality of solder interconnects (e.g., 332) to the interconnect integrated device (e.g., 201). A solder reflow process may be used to couple the plurality of solder interconnects to the interconnect integrated device. Stage 13 of FIG. 8D may illustrate an example of solder interconnects coupled to an interconnect integrated device.

In some implementations, the interconnect integrated device 201 is part of a wafer, and singulation may be performed to cut the wafer into individual interconnect integrated devices. The method 900 may be used to fabricate an interconnect integrated device 201 that includes the plurality of interconnects 212.

Exemplary Integrated Devices Comprising Pillar Interconnects

FIGS. 10 and 11 illustrate examples of integrated devices and interconnect integrated devices comprising pillar interconnects. FIG. 10 illustrates the first integrated device 204 and the interconnect integrated device 201. The first integrated device 204 includes a seed layer 1010, a plurality of pillar interconnects 1040, a plurality of solder interconnects 1012 and a plurality of solder interconnects 1042. The seed layer 1010 is located over a front side of the first integrated device 204. The seed layer 1010 may be coupled to interconnects of the first integrated device 204. The plurality of solder interconnects 1012 is coupled to the seed layer 1010. The plurality of pillar interconnects 1040 is coupled to the seed layer 1010. The plurality of solder interconnects 1042 is coupled to the plurality of pillar interconnects 1040.

The interconnect integrated device 201 includes a seed layer 1011, a plurality of pillar interconnects 1030 and a plurality of solder interconnects 1032. The seed layer 1011 may be coupled to the interconnects of the interconnect integrated device 201. The plurality of pillar interconnects 1030 is coupled to the seed layer 1011. The plurality of solder interconnects 1032 is coupled to the plurality of pillar interconnects 1030.

The interconnect integrated device 201 may be coupled to the first integrated device 204 through the seed layer 1011, the plurality of pillar interconnects 1030, the plurality of solder interconnects 1032, the plurality of solder interconnects 1012 and the seed layer 1010. The plurality of solder interconnects 1012 and the plurality of solder interconnect 1032 may combine to become the plurality of solder interconnects 232 (e.g., 232a). The first integrated device 204 may be coupled to a substrate through the seed layer 1010, the plurality of pillar interconnects 1040 and the plurality of solder interconnects 1042. The plurality of pillar interconnects 1040 may represent the plurality of pillar interconnects 240. The plurality of solder interconnects 1042 may represent the plurality of solder interconnects 242.

FIG. 11 illustrates another configuration of the first integrated device 204 and the interconnect integrated device 201. The first integrated device 204 includes the seed layer 1010, the plurality of pillar interconnects 1040, a plurality of pillar interconnects 1130, the plurality of solder interconnects 1012 and the plurality of solder interconnects 1042. The seed layer 1010 is located over a front side of the first integrated device 204. The seed layer 1010 may be coupled to interconnects of the first integrated device 204. The plurality of pillar interconnects 1130 is coupled to the seed layer 1010. The plurality of solder interconnects 1012 is coupled to the plurality of pillar interconnects 1130. The plurality of pillar interconnects 1040 is coupled to the seed layer 1010. The plurality of solder interconnects 1042 is coupled to the plurality of pillar interconnects 1040.

The interconnect integrated device 201 includes the seed layer 1011 and the plurality of solder interconnects 1032. The seed layer 1011 may be coupled to the interconnects of the interconnect integrated device 201. The plurality of solder interconnects 1032 is coupled to the seed layer 1011.

The interconnect integrated device 201 may be coupled to the first integrated device 204 through the seed layer 1011, the plurality of solder interconnects 1032, the plurality of solder interconnects 1012, the plurality of pillar interconnects 1130, and the seed layer 1010. The plurality of solder interconnects 1012 and the plurality of solder interconnect 1032 may combine to become the plurality of solder interconnects 332. The first integrated device 204 may be coupled to a substrate through the seed layer 1010, the plurality of pillar interconnects 1040 and the plurality of solder interconnects 1042. The plurality of pillar interconnects 1040 may represent the plurality of pillar interconnects 240. The plurality of solder interconnects 1042 may represent the plurality of solder interconnects 242.

The seed layer, the pillar interconnects and solder interconnects described in FIGS. 10 and 11 may be applicable any of the integrated devices of the disclosure, including the second integrated device 206, the third integrated device 704 and/or the fourth integrated device 706.

Figure 12A:
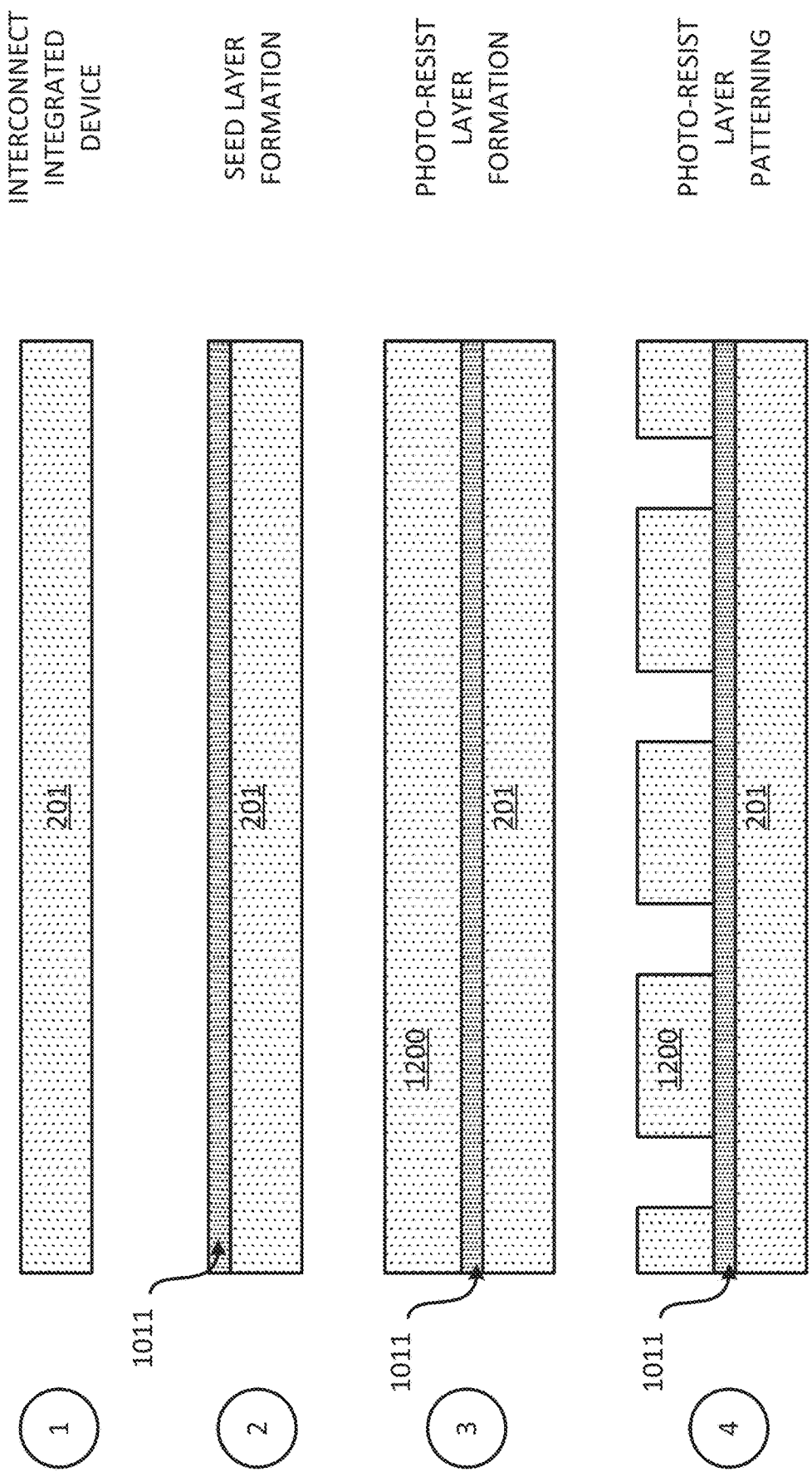
FIGS. 12A-12B illustrate an exemplary sequence for fabricating an interconnect integrated device with pillar interconnects.
Figure 12B:
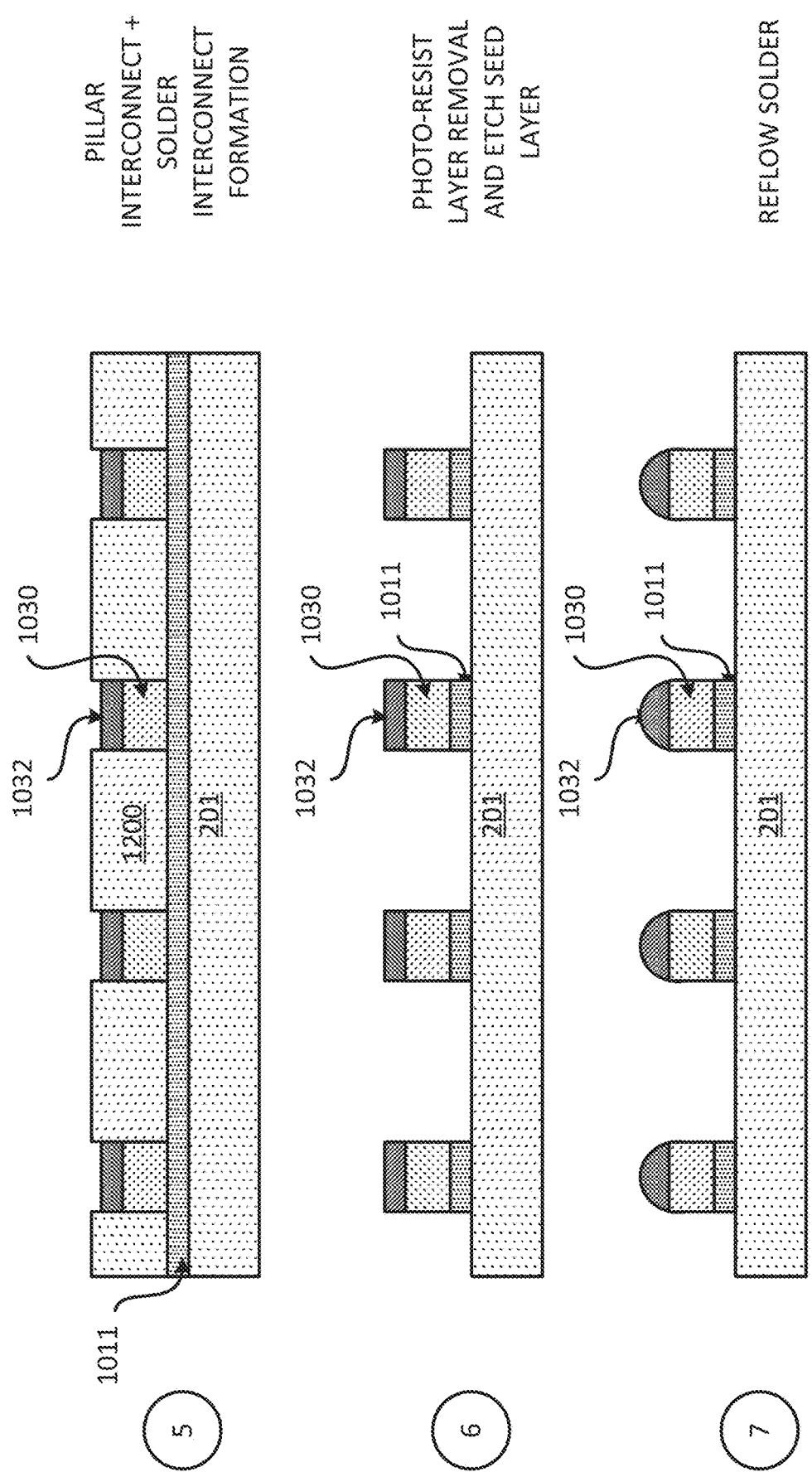

Exemplary Sequence for Fabricating a High-Density Interconnect Integrated Device with Pillar Interconnects FIGS. 12A-12B illustrate an exemplary sequence for providing or fabricating a high-density interconnect integrated device with pillar interconnects. In some implementations, the sequence of FIGS. 12A-12B may be used to provide or fabricate the interconnect integrated device 201 of FIG. 2, or any of the interconnect integrated device described in the disclosure.

It should be noted that the sequence of FIGS. 12A-12B may combine one or more stages in order to simplify and/or clarify the sequence for providing or fabricating the interconnect integrated device. In some implementations, the order of the processes may be changed or modified. In some implementations, one or more of processes may be replaced or substituted without departing from the scope of the disclosure. Different implementations may fabricate an interconnect integrated device differently.

Stage 1, as shown in FIG. 12A, illustrates a state after an interconnect integrated device 201 is provided. Stages 1-12 of FIGS. 8A-8D illustrate and describe an example of fabricating an interconnect integrated device. The interconnect integrated device 201 may be configured as bridge (e.g., bridge die) between integrated devices (e.g., dies).

Stage 2 illustrates a state after a seed layer 1011 is formed over the front side of the interconnect integrated device 201. The seed layer 1011 may include a metal layer. The seed layer 1011 may be deposited over the interconnect integrated device 201. A plating process may be used to form the seed layer 1011.

Stage 3 illustrates a state after a photo-resist layer 1200 is formed over the seed layer 1011. The photo-resist layer 1200 may be deposited over the seed layer 1011.

Stage 4 illustrates a state after the photo-resist layer 1200 is patterned, creating at least one opening in the photo-resist layer 1200 that exposes part of the seed layer 1011.

Stage 5, as shown in FIG. 12B, illustrates a state after a plurality of pillar interconnects 1030 and a plurality of solder interconnects 1032 are located over the seed layer 1011, through openings in the photo-resist layer 1200. The plurality of pillar interconnects 1030 may be formed over the seed layer 1011 through a plating process. The plurality of solder interconnects 1032 may be formed over the plurality of pillar interconnects 1030 through a deposition process.

Stage 6 illustrates a state after the photo-resist layer 1200 is removed, and part of the seed layer 1011 is removed (e.g., etched). Removing the photo-resist layer 1200 may include stripping the photo-resist layer 1200.

Stage 7 illustrates a state after a reflow solder process that couples (e.g. bonds) the plurality of solder interconnects 1032 to the plurality of pillar interconnects 1030. Stage 7 may illustrate an interconnect integrated device (e.g., 201) with pillar interconnects that may be coupled to two or more integrated devices.

Figure 13A:
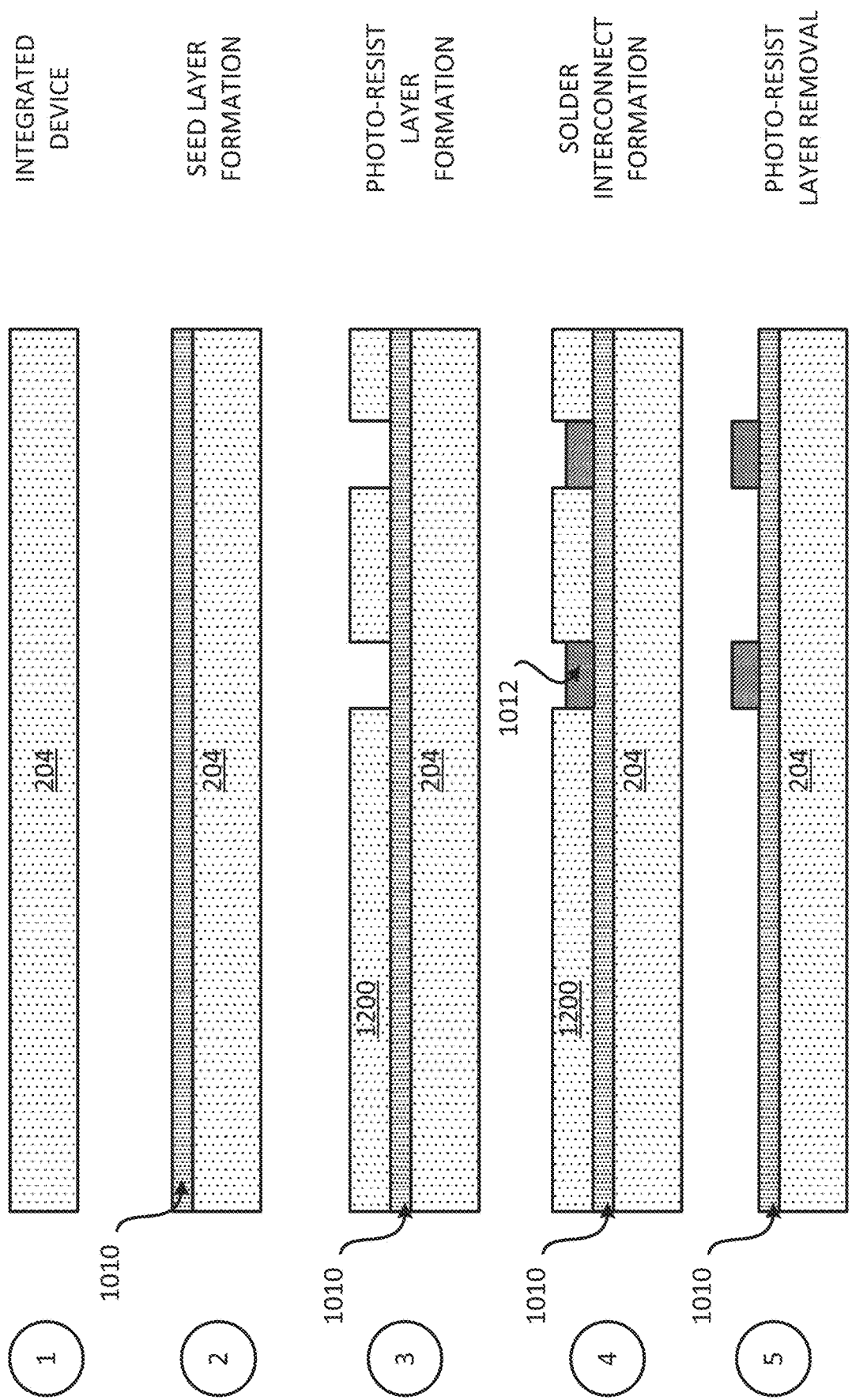
FIGS. 13A-13B illustrate another exemplary sequence for fabricating an integrated device with pillar interconnects.
Figure 13B:
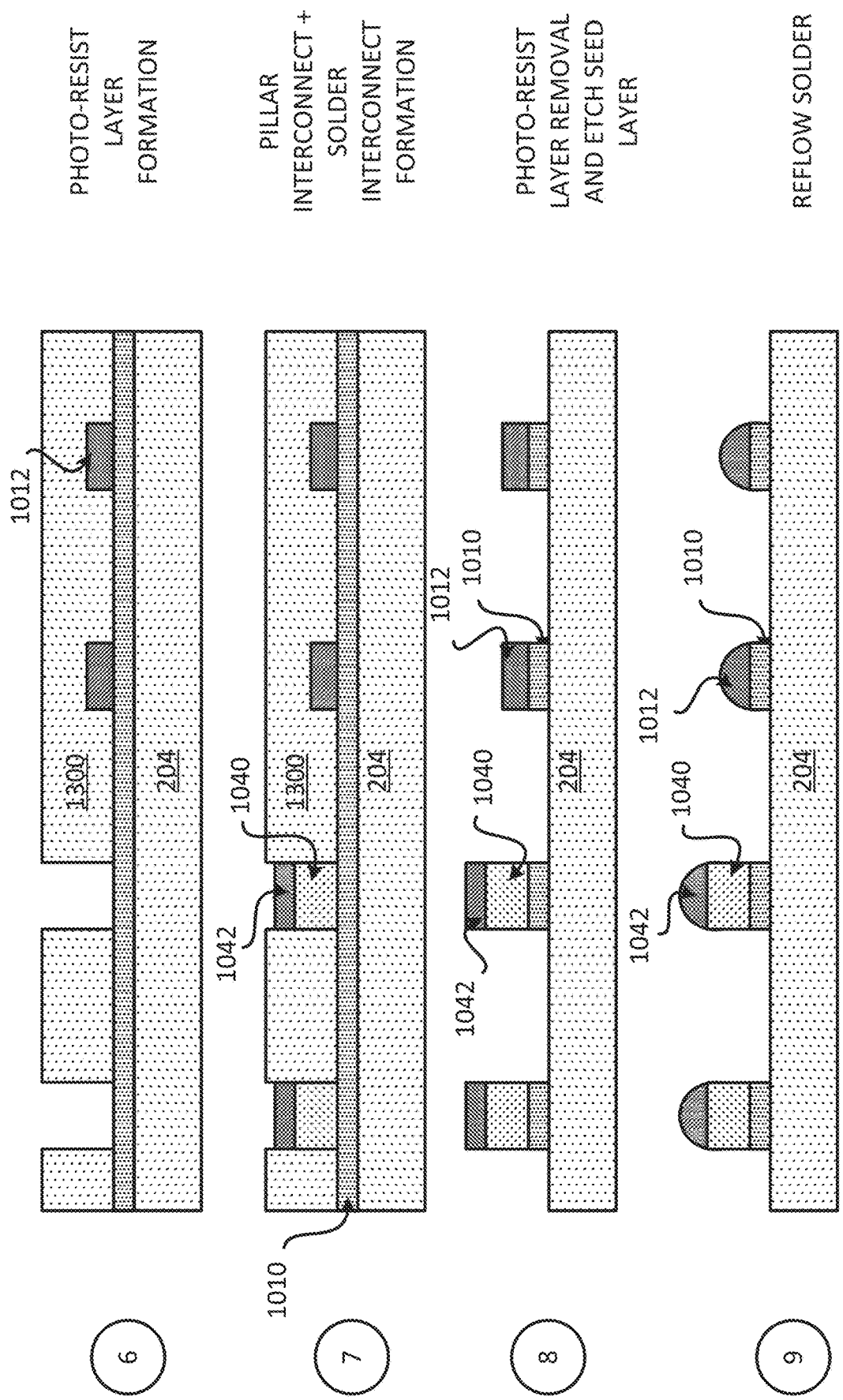

Exemplary Sequence for Fabricating an Integrated Device with Pillar Interconnects FIGS. 13A-13B illustrate an exemplary sequence for providing or fabricating an integrated device with pillar interconnects. In some implementations, the sequence of FIGS. 13A-13B may be used to provide or fabricate the first integrated device 204 of FIG. 2, or any of the integrated devices (e.g., 206, 704, 706) described in the disclosure.

It should be noted that the sequence of FIGS. 13A-13B may combine one or more stages in order to simplify and/or clarify the sequence for providing or fabricating the integrated device with pillar interconnects. In some implementations, the order of the processes may be changed or modified. In some implementations, one or more of processes may be replaced or substituted without departing from the scope of the disclosure. Different implementations may fabricate an integrated device differently.

Stage 1, as shown in FIG. 13A, illustrates a state after a first integrated device 204 is provided. The first integrated device 204 may include a die with active devices, such as transistors.

Stage 2 illustrates a state after a seed layer 1010 is formed over the front side of the first integrated device 204. The seed layer 1010 may include a metal layer. The seed layer 1010 may be deposited over the first integrated device 204. A plating process may be used to form the seed layer 1010.

Stage 3 illustrates a state after a photo-resist layer 1200 is formed and patterned over the seed layer 1010. The photo-resist layer 1200 may be deposited over the seed layer 1010 and patterned, creating at least one opening in the photo-resist layer 1200 that exposes part of the seed layer 1010.

Stage 4 illustrates a state after a plurality of solder interconnects 1012 is located over the seed layer 1010, through openings in the photo-resist layer 1200. The plurality of solder interconnects 1012 may be formed over the seed layer 1010 through a deposition process.

Stage 5 illustrates a state after the photo-resist layer 1200 is removed. Removing the photo-resist layer 1200 may include stripping the photo-resist layer 1200.

Stage 6, as shown in FIG. 13B, illustrates a state after a photo-resist layer 1300 is formed and patterned over the seed layer 1010 and the plurality of solder interconnects 1012. The photo-resist layer 1300 may be deposited over the seed layer 1010 and patterned, creating at least one opening in the photo-resist layer 1300 that exposes part of the seed layer 1010.

Stage 7 illustrates a state after a plurality of pillar interconnects 1040 and a plurality of solder interconnects 1042 are located over the seed layer 1010, through openings in the photo-resist layer 1300. The plurality of pillar interconnects 1040 may be formed over the seed layer 1010 through a plating process. The plurality of solder interconnects 1042 may be formed over the plurality of pillar interconnects 1040 through a deposition process.

Stage 8 illustrates a state after the photo-resist layer 1300 is removed, and part of the seed layer 1010 is removed (e.g., etched). Removing the photo-resist layer 1300 may include stripping the photo-resist layer 1300.

Stage 9 illustrates a state after a reflow solder process that couples (e.g. bonds) the plurality of solder interconnects 1042 to the plurality of pillar interconnects 1040, and the plurality of solder interconnects 1012 to the seed layer 1010. Stage 9 may illustrate an integrated device (e.g., 204, 206, 704, 706) that may be coupled to an interconnect integrated device and/or a substrate.

Figure 14:
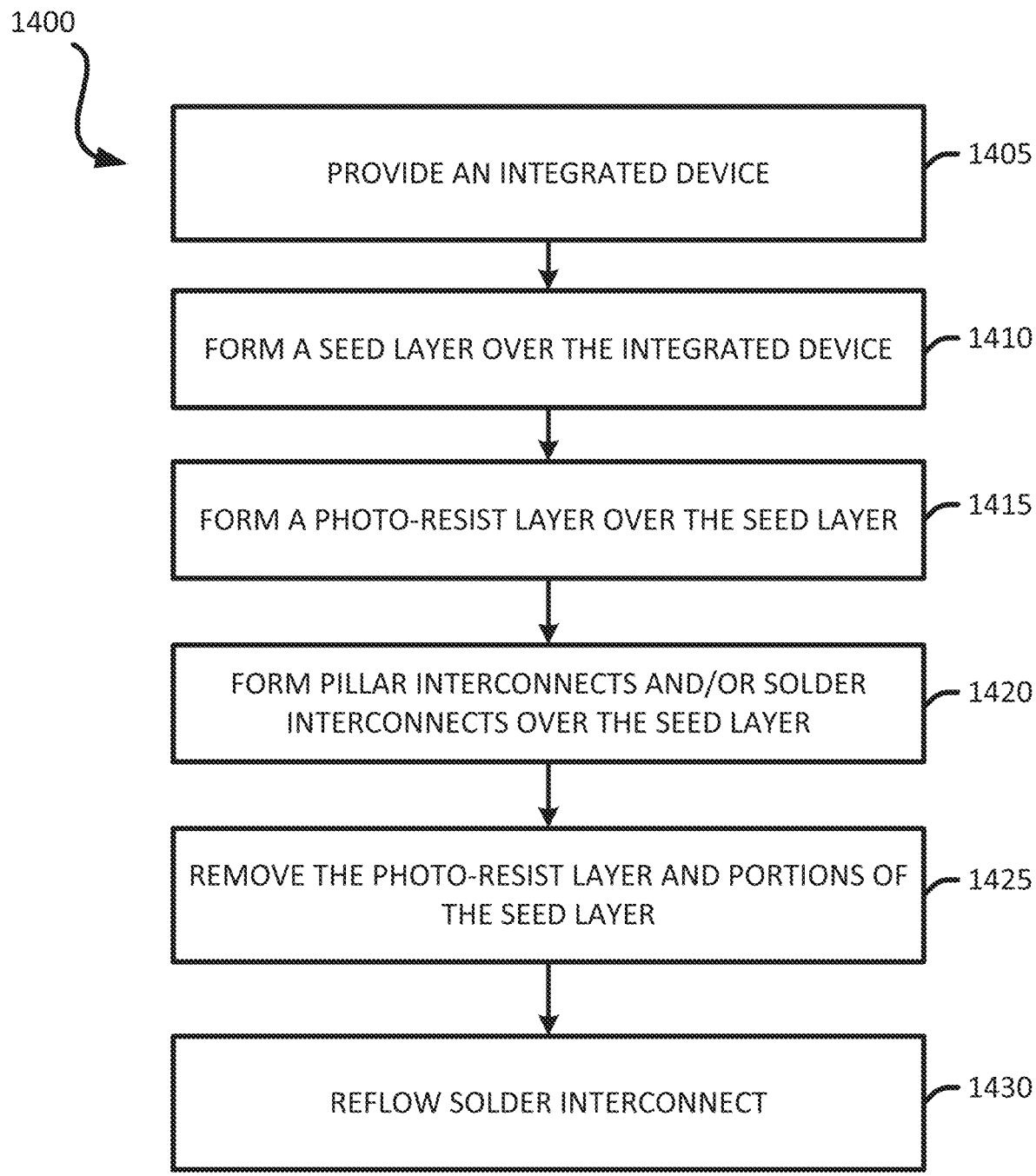
FIG. 14 illustrates an exemplary flow diagram of a method for fabricating an integrated device with pillar interconnects.

Exemplary Flow Diagram of a Method for Fabricating an Integrated Device Comprising Pillar Interconnects In some implementations, fabricating an integrated device with pillar interconnects includes several processes. FIG. 14 illustrates an exemplary flow diagram of a method 1400 for providing or fabricating an interconnect integrated device with pillar interconnects. In some implementations, the method 1400 of FIG. 14 may be used to provide or fabricate the integrated device (e.g., 204, 206,) of FIG. 2 described in the disclosure. However, the method 1400 may be used to provide or fabricate any of integrated devices and/or interconnect integrated device (e.g., 201) described in the disclosure.

It should be noted that the method of FIG. 14 may combine one or more processes in order to simplify and/or clarify the method for providing or fabricating an integrated device with pillar interconnects. In some implementations, the order of the processes may be changed or modified.

The method provides (at 1405) an integrated device (e.g., 204, 206). Stage 1 of FIG. 13A illustrates a first integrated device 204 that is provided. The first integrated device 204 may include a die with active devices, such as transistors. In some implementations, the integrated device that is provided is an interconnect integrated device (e.g., 201).

The method forms (at 1410) a seed layer (e.g., 1010) over a front side of the integrated device. The seed layer 1010 may include a metal layer. The seed layer 1010 may be deposited over the integrated device 204. A plating process may be used to form the seed layer 1010. Stage 2 of FIG. 13A illustrates and describes an example of forming a seed layer.

The method forms (at 1415) a photo-resist layer (e.g., 1200) over the seed layer (e.g., 1010). The photo-resist layer 1200 may be formed and patterned over the seed layer 1010. The photo-resist layer 1200 may be deposited over the seed layer 1010 and patterned, creating at least one opening in the photo-resist layer 1200 that exposes part of the seed layer 1010. Stage 3 of FIG. 13A illustrates and describes an example of forming a photo-resist layer over a seed layer.

The method forms (at 1420) a plurality of pillar interconnects (e.g., 1040) and/or solder interconnects (e.g., 1042) over the seed layer (e.g., 1010) through openings in the photo-resist layer (e.g., 1200). The plurality of solder interconnects may be formed over the seed layer through a deposition process. The plurality of pillar interconnects may be formed over the seed layer through a plating process. The plurality of solder interconnects may be formed over the plurality of pillar interconnects through a deposition process. Stages 4 and 7 of FIGS. 13A and 13B illustrate examples of forming a plurality of pillar interconnects and/or a plurality of solder interconnects.

The method removes (at 1425) a photo-resist layer (e.g., 1200). Removing the photo-resist layer may include stripping the photo-resist layer. Stages 5 and 8 of FIGS. 13A and 13B illustrate examples of removing a photo-resist layer. In some implementations, portions of a seed layer may also be removed. An etching process may be used to remove portions of the seed layer. Stage 8 of FIG. 13B illustrates an example of a portion of a seed layer that is removed. It is noted that forming a photo-resist layer, pillar interconnects and/or solder interconnects and removing the photo-resist layer, as described at 1415, 1420, and 1425, may be repeated.

The method performs (at 1430) a reflow solder process that couples (e.g. bonds) the plurality of solder interconnects (e.g., 1042) to the plurality of pillar interconnects (e.g., 1040), and/or the plurality of solder interconnects (e.g., 1012) to the seed layer (e.g., 1010). Stage 9 of FIG. 13B illustrates and describes an example of a reflow solder process.

In some implementations, the integrated device is part of a wafer, and singulation may be performed to cut the wafer into individual integrated devices. The method 1400 may be used to fabricate any integrated device described in the disclosure, including an interconnect integrated device.

Exemplary Sequence for Fabricating a Substrate

Figure 15A:
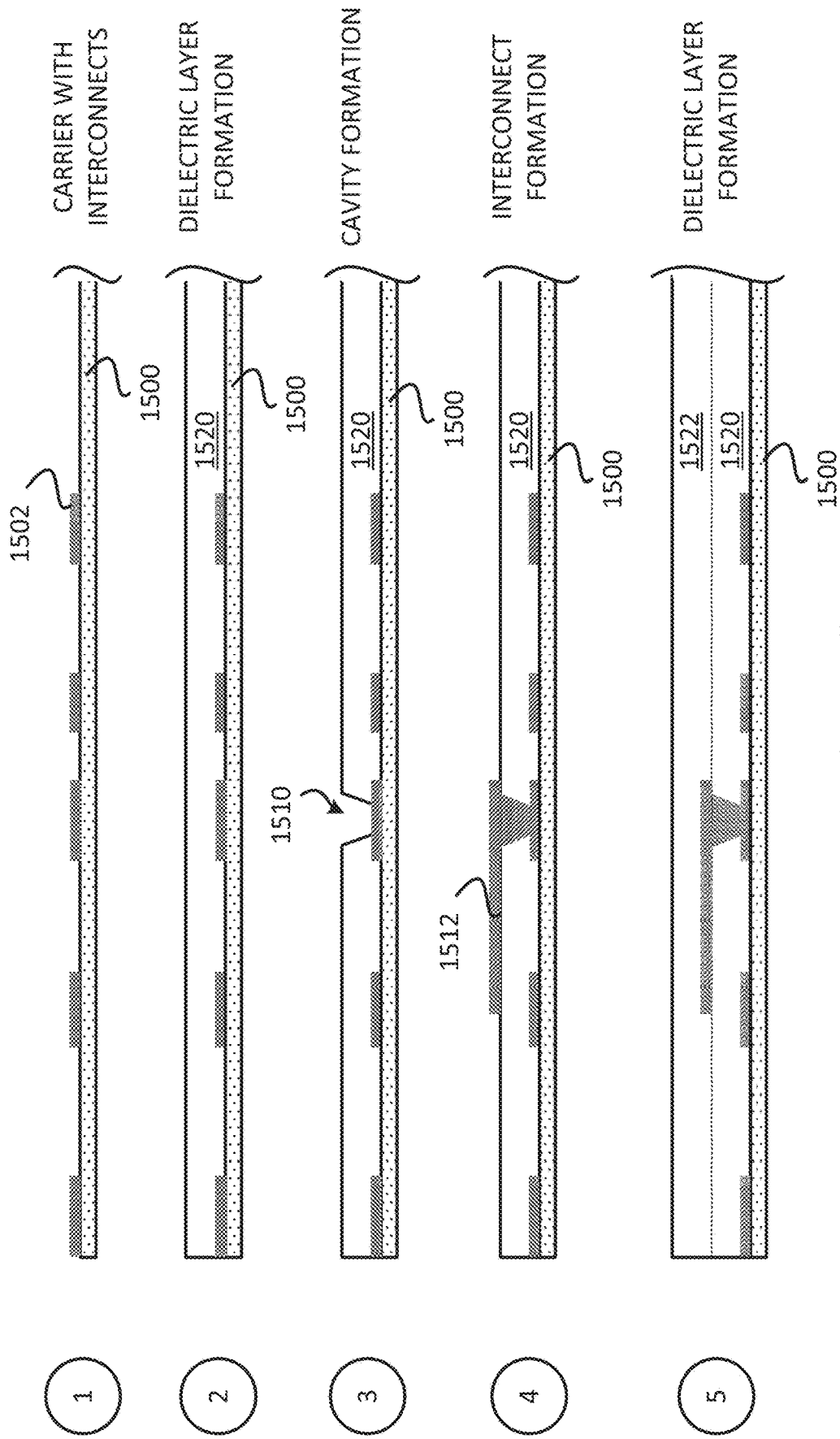
Figure 15C:
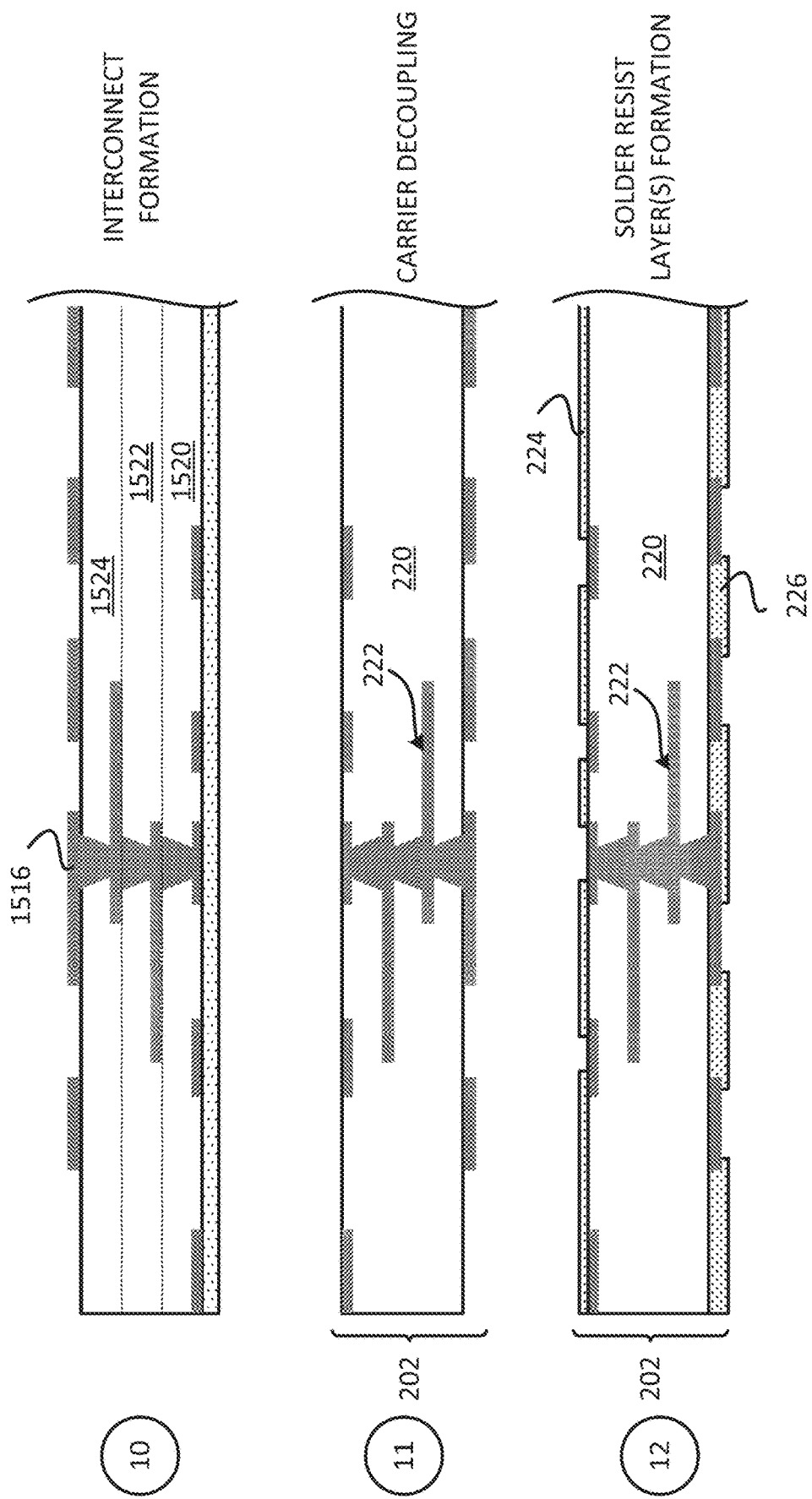

In some implementations, fabricating a substrate includes several processes. FIGS. 15A-15C illustrate an exemplary sequence for providing or fabricating a substrate. In some implementations, the sequence of FIGS. 15A-15C may be used to provide or fabricate the substrate 202 of FIG. 2. However, the process of FIGS. 15A-15C may be used to fabricate any of the substrates described in the disclosure.

It should be noted that the sequence of FIGS. 15A-15C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 15A, illustrates a state after a carrier 1500 is provided and a metal layer is formed over the carrier 1500. The metal layer may be patterned to form interconnects 1502. A plating process and etching process may be used to form the metal layer and interconnects.

Stage 2 illustrates a state after a dielectric layer 1520 is formed over the carrier 1500 and the interconnects 1502. The dielectric layer 1520 may include polyimide. However, different implementations may use different materials for the dielectric layer.

Stage 3 illustrates a state after a plurality of cavities 1510 is formed in the dielectric layer 1520. The plurality of cavities 1510 may be formed using an etching process (e.g., photo etching process) or laser process.

Stage 4 illustrates a state after interconnects 1512 are formed in and over the dielectric layer 1520. For example, a via, pad and/or traces may be formed. A plating process may be used to form the interconnects.

Stage 5 illustrates a state after another dielectric layer 1522 is formed over the dielectric layer 1520. The dielectric layer 1522 may be the same material as the dielectric layer 1520. However, different implementations may use different materials for the dielectric layer.

Stage 6, as shown in FIG. 15B, illustrates a state after a plurality of cavities 1530 is formed in the dielectric layer 1522. An etching process or laser process may be used to form the cavities 1530.

Stage 7 illustrates a state after interconnects 1514 are formed in and over the dielectric layer 1522. For example, via, pad and/or trace may be formed. A plating process may be used to form the interconnects.

Stage 8 illustrates a state after another dielectric layer 1524 is formed over the dielectric layer 1522. The dielectric layer 1524 may be the same material as the dielectric layer 1520. However, different implementations may use different materials for the dielectric layer.

Stage 9 illustrates a state after a plurality of cavities 1540 is formed in the dielectric layer 1524. An etching process or laser process may be used to form the cavities 1540.

Stage 10, as shown in FIG. 15C, illustrates a state after interconnects 1516 are formed in and over the dielectric layer 1524. For example, via, pad and/or trace may be formed. A plating process may be used to form the interconnects.

Some or all of the interconnects 1502, 1512, 1514 and/or 1516 may define the plurality of interconnects 222 of the substrate 202. The dielectric layers 1520, 1522, 1524 may be represented by the at least one dielectric layer 220.

Stage 11 illustrates a state after the carrier 1500 is decoupled (e.g., removed, grinded out) from the dielectric layer 220, leaving the substrate 202 that includes the at least one dielectric layer 220 and the plurality of interconnects 222.

Stage 12 illustrates a state after the first solder resist layer 224 and the second solder resist layer 226 are formed over the substrate 202.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 16:
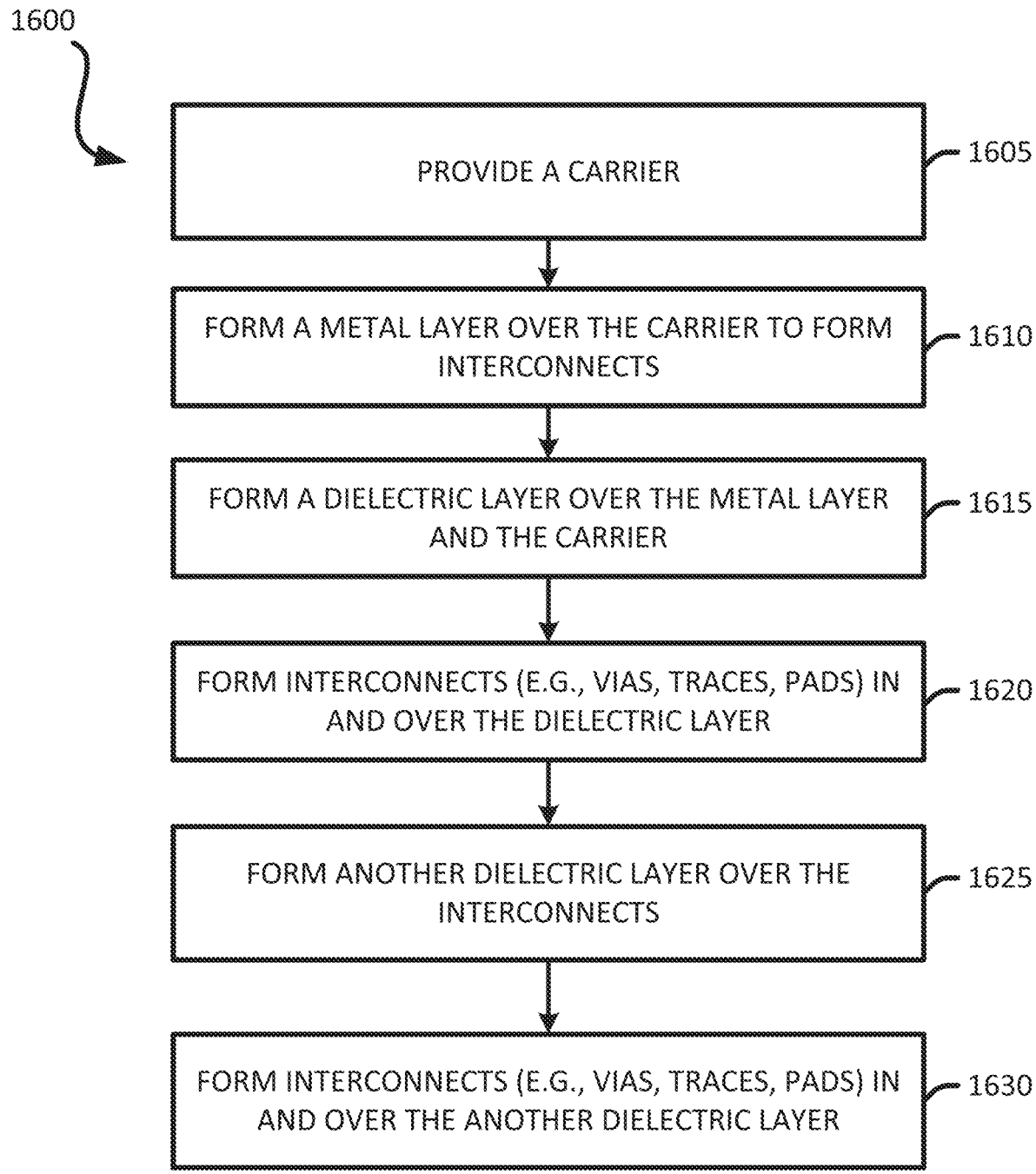
FIG. 16 illustrates an exemplary flow diagram of a method for fabricating a substrate.

In some implementations, fabricating a substrate includes several processes. FIG. 16 illustrates an exemplary flow diagram of a method 1600 for providing or fabricating a substrate. In some implementations, the method 1600 of FIG. 16 may be used to provide or fabricate the substrate of FIG. 2. For example, the method of FIG. 16 may be used to fabricate the substrate 202.

It should be noted that the method of FIG. 16 may combine one or more processes in order to simplify and/or clarify the method for providing or fabricating a substrate. In some implementations, the order of the processes may be changed or modified.

The method provides (at 1605) a carrier 1500. Different implementations may use different materials for the carrier. The carrier may include a substrate, glass, quartz and/or carrier tape. Stage 1 of FIG. 15A illustrates a state after a carrier is provided.

The method forms (at 1610) a metal layer over the carrier 1500. The metal layer may be patterned to form interconnects. A plating process may be used to form the metal layer and interconnects. Stage 1 of FIG. 15A illustrates an example of a metal layer and interconnects 1502 that are formed.

The method forms (at 1615) a dielectric layer 1520 over the carrier 1500 and the interconnects 1502. The dielectric layer 1520 may include polyimide. Forming the dielectric layer may also include forming a plurality of cavities (e.g., 1510) in the dielectric layer 1520. The plurality of cavities may be formed using an etching process (e.g., photo etching) or laser process. Stages 2-3 of FIG. 15A illustrate an example of forming a dielectric layer and cavities in the dielectric layer.

The method forms (at 1620) interconnects in and over the dielectric layer. For example, the interconnects 1512 may be formed in and over the dielectric layer 1520. A plating process may be used to form the interconnects. Forming interconnects may include providing a patterned metal layer over and/or in the dielectric layer. Stage 4 of FIG. 15A illustrates an example of forming interconnects in and over a dielectric layer.

The method forms (at 1625) a dielectric layer 1522 over the dielectric layer 1520 and the interconnects. The dielectric layer 1522 may include polyimide. Forming the dielectric layer may also include forming a plurality of cavities (e.g., 1530) in the dielectric layer 1522. The plurality of cavities may be formed using an etching process or laser process. Stages 5-6 of FIGS. 15A-15B illustrate an example of forming a dielectric layer and cavities in the dielectric layer.

The method forms (at 1630) interconnects in and/or over the dielectric layer. For example, the interconnects 1514 may be formed. A plating process may be used to form the interconnects. Forming interconnects may include providing a patterned metal layer over an in the dielectric layer. Stage 7 of FIG. 15B illustrates an example of forming interconnects in and over a dielectric layer.

The method may form additional dielectric layer(s) and additional interconnects as described at 1625 and 1630. Stages 8-10 of FIG. 15B-15C illustrate an example of forming interconnects in and over a dielectric layer.

Once all the dielectric layer(s) and additional interconnects are formed, the method may decouple (e.g., remove, grind out) the carrier (e.g., 1500) from the dielectric layer 1520, leaving the substrate. In some implementations, the method may form solder resist layers (e.g., 224, 226) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 17A:
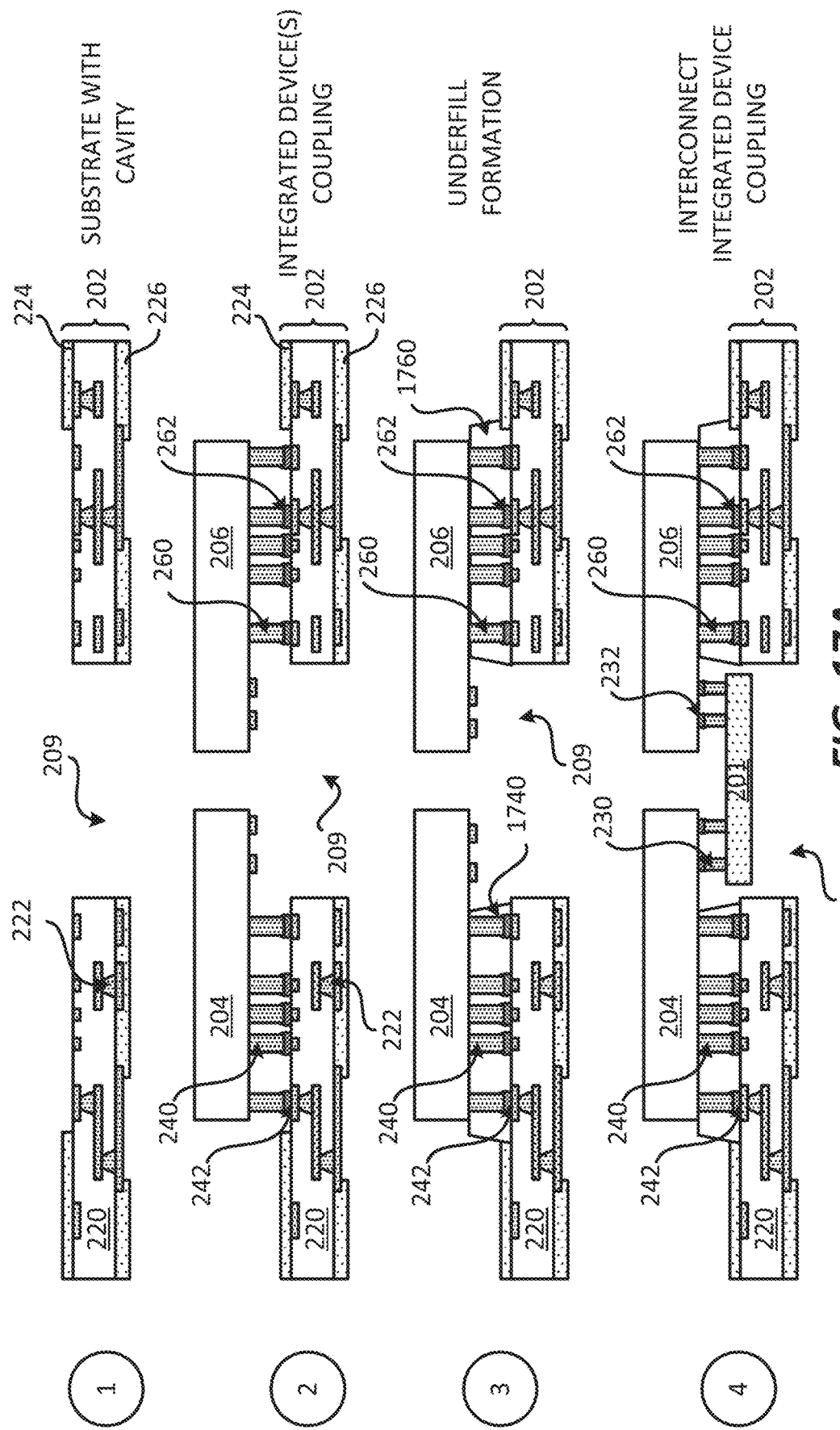
FIGS. 17A-17B illustrate an exemplary sequence for fabricating a package that includes a high-density interconnect integrated device.
Figure 17B:
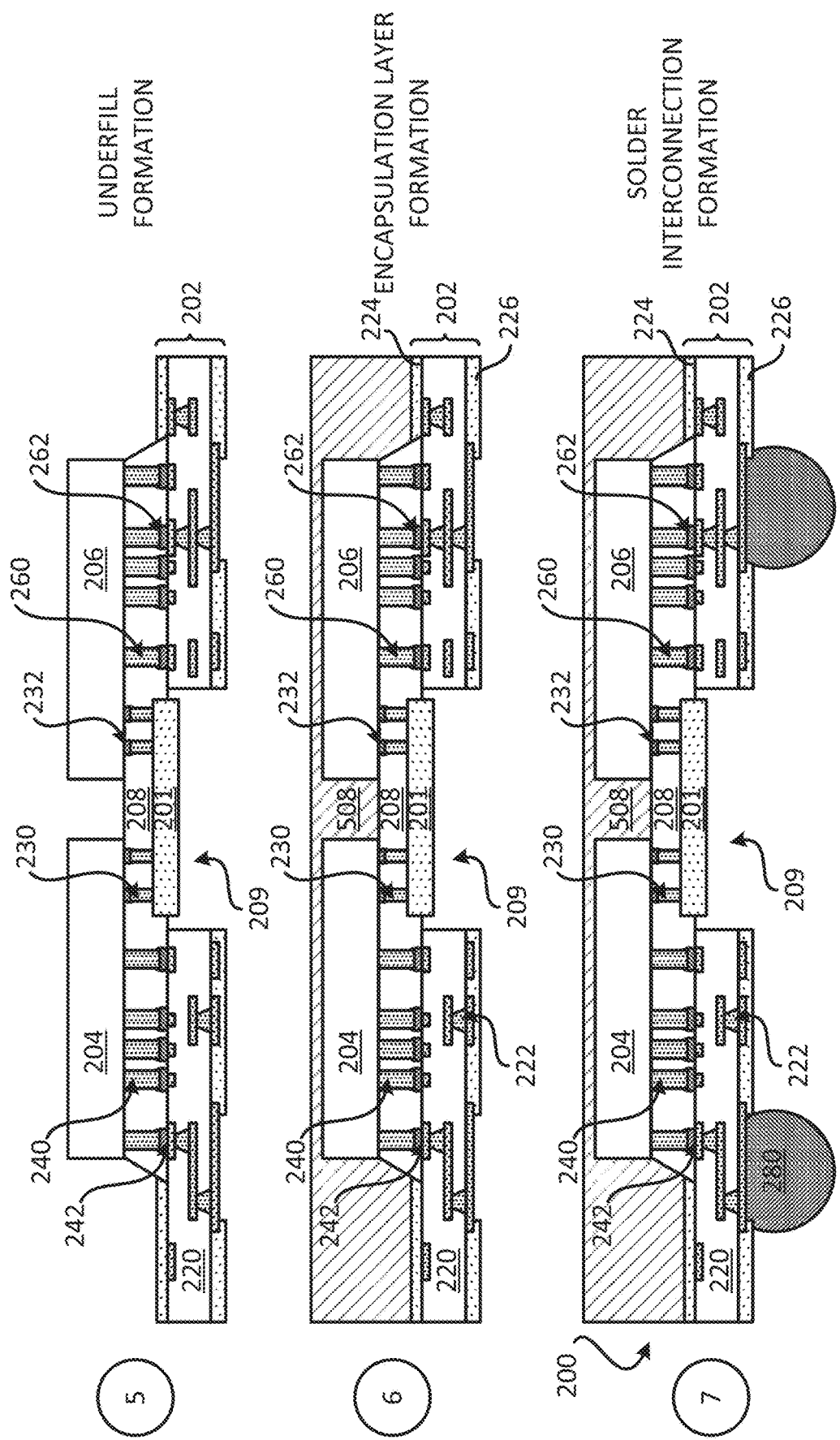

Exemplary Sequence for Fabricating a Package that Includes a High-Density Interconnect Integrated Device FIGS. 17A-17B illustrate an exemplary sequence for providing or fabricating a package that includes a high-density interconnect integrated device. In some implementations, the sequence of FIGS. 17A-17B may be used to provide or fabricate the package 500 that includes the substrate 202 and the interconnect integrated device 201 of FIG. 5, or any of the packages described in the disclosure.

It should be noted that the sequence of FIGS. 17A-17B may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 17A-17B may be used to fabricate one package or several packages at a time (as part of a wafer).

Stage 1, as shown in FIG. 17A, illustrates a state after the substrate 202 is provided. The substrate 202 may be provided by a supplier or fabricated. A process similar to the process shown in FIGS. 15A-15C may be used to fabricate the substrate 202. However, different implementations may use different processes to fabricate the substrate 202. Examples of processes that may be used to fabricate the substrate 202 include a semi-additive process (SAP) and a modified semi-additive process (mSAP). The substrate 202 includes at least one dielectric layer 220, and a plurality of interconnects 222. The substrate 202 may be a laminate substrate, a coreless substrate, an organic substrate, a substrate that includes a core layer. In some implementations, the at least one dielectric layer 220 may include a core layer and/or prepreg layers. The substrate 202 includes a cavity 209. The cavity 209 may be fabricated using a laser process (e.g., laser ablation).

Stage 2 illustrates a state after the integrated device 204 and the integrated device 206 are coupled to a first surface (e.g., top surface) of the substrate 202. The integrated device 204 is coupled to the substrate 202 through the plurality of pillar interconnects 240 and/or the plurality of solder interconnects 242. The integrated device 206 is coupled to the substrate 202 through the plurality of pillar interconnects 260 and/or the plurality of solder interconnects 262. Portions of the integrated device 204 and portions of the integrated device 206 may be located over the cavity 209. The integrated device 204 may be coupled to the substrate 202 such that the front side (e.g., active side) of the integrated device 204 is facing the substrate 202. Similarly, the integrated device 206 may be coupled to the substrate 202 such that the front side of the integrated device 206 is facing the substrate 202.

Stage 3 illustrates a state after an underfill 1740 is provided (e.g., formed) between the substrate 202 and the integrated device 204, and an underfill 1760 is provided (e.g., formed) between the substrate 202 and the integrated device 206. The underfill (e.g., 1740, 1760) may be provided around the pillar interconnects (e.g., 240, 260) and/or the solder interconnects (e.g., 242, 262) through capillary action and/or forces. The capillary properties of the underfill allow the underfill to fill the small space and/or small gap between the integrated devices and the substrate.

Stage 4 illustrates a state after the interconnect integrated device 201 is coupled to the integrated device 204 and the integrated device 206. The interconnect integrated device 201 is coupled to the integrated device 204 through a plurality of pillar interconnects 230 and/or a plurality of solder interconnects 232. Similarly, the interconnect integrated device 201 is coupled to the integrated device 206 through a plurality of pillar interconnects 230 and/or a plurality of solder interconnects 232. In some implementations, the substrate 202 and the integrated devices 204 and 206 are flipped before the interconnect integrated device 201 is coupled to the integrated devices 204 and 206. A reflow solder process may be used to couple the interconnect integrated device 201 to the integrated devices 204 and 206.

Stage 5, as shown in FIG. 17B, illustrates a state after an underfill 208 is provided (e.g., formed) between the interconnect integrated device 201 and the integrated devices 204 and 206. The underfill 208 may be provided through capillary action and/or forces. The capillary properties of the underfill allow the underfill to fill the small space and/or small gap between the integrated devices and the substrate. The underfill 208 may include the underfill 1740 and the underfill 1760. The underfill 208 may represent one or more layers of underfill. As mentioned above, the underfill 208 helps provide mechanical coupling between the interconnect integrated device 201 and the integrated devices 204 and 206, which helps provides a strong and reliable electrical connection between the interconnect integrated device 201 and the integrated devices 204 and 206, by keeping the interconnect integrated device 201 and the integrated devices 204 and 206 together. A flux process may be applied before the underfill 208 is provided.

Stage 6 illustrates a state after the encapsulation layer 508 is formed over the first surface of the substrate 202 such that the encapsulation layer 508 encapsulates the first integrated device 204 and the second integrated device 206. The process of forming and/or depositing the encapsulation layer 508 may include using a compression and transfer molding process, a sheet molding process, or a liquid molding process. It is noted that in some implementations, the encapsulation layer 508 may replace the underfill (e.g., 1740, 1760, 208), as described in FIG. 7. Thus, in some implementations, the encapsulation layer 508 may be formed and located in regions that are occupied by the underfill 208.

Stage 7 illustrates a state after the plurality of solder interconnects 280 is coupled to the substrate 202. A reflow solder process may be used to couple the plurality of solder interconnects. Stage 8 may illustrate the package 200 that includes the substrate 202, the first integrated device 204, the second integrated device 206, the interconnect integrated device 201, the underfill 208 and the encapsulation layer 508, as described in at least FIG. 5.

The packages (e.g., 200, 300, 400, 500, 600, 700) described in the disclosure may be fabricated one at a time or may be fabricated together as part of one or more wafers and then singulated into individual packages.

Figure 18:
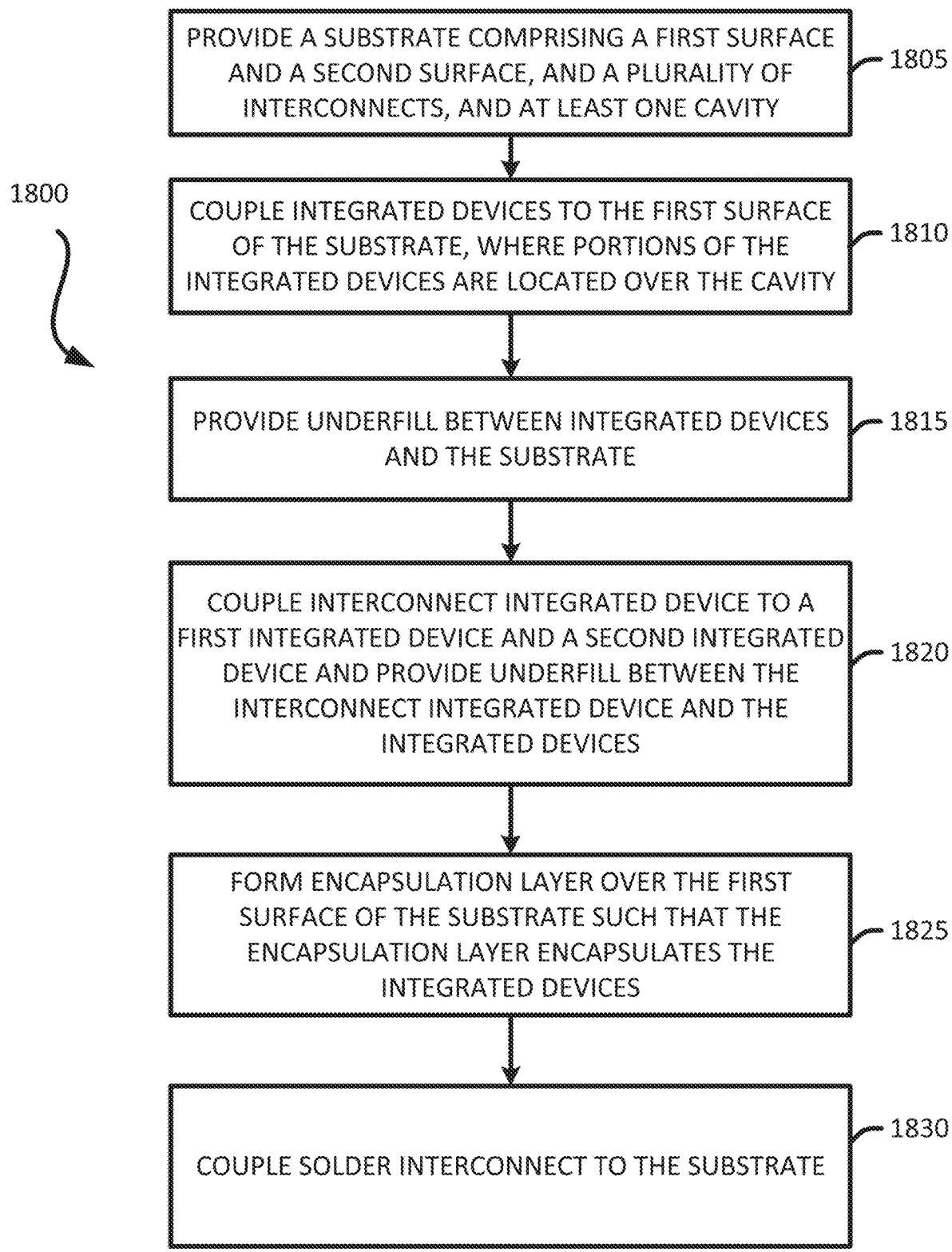
FIG. 18 illustrates an exemplary flow diagram of a method for fabricating a package that includes a high-density interconnect integrated device.

Exemplary Flow Diagram of a Method for Fabricating a Package that Includes a High-Density Interconnect Integrated Device In some implementations, fabricating a package that includes a high-density interconnect integrated device includes several processes. FIG. 18 illustrates an exemplary flow diagram of a method 1800 for providing or fabricating a package that includes a high-density interconnect integrated device coupled to a substrate. In some implementations, the method 1800 of FIG. 18 may be used to provide or fabricate the package 500 of FIG. 5 described in the disclosure. However, the method 1800 may be used to provide or fabricate any of the packages described in the disclosure.

It should be noted that the method of FIG. 18 may combine one or more processes in order to simplify and/or clarify the method for providing or fabricating a package that includes a high-density interconnect integrated device. In some implementations, the order of the processes may be changed or modified.

The method provides (at 1805) a substrate (e.g., 202). The substrate 202 may be provided by a supplier or fabricated. The substrate 202 includes a first surface and a second surface. The substrate 202 includes at least one dielectric layer 220 and a plurality of interconnects 222. The substrate 202 may include at least one cavity 209. Different implementations may provide different substrates. A process similar to the process shown in FIGS. 15A-15C may be used to fabricate the substrate 202. However, different implementations may use different processes to fabricate the substrate 202. Stage 1 of FIG. 17A illustrates and describes an example of providing a substrate.

The method couples (at 1810) integrated devices to a substrate. For example, the method may couple the integrated device 204 and the integrated device 206 to a first surface (e.g., top surface) of the substrate 202. The integrated device 204 is coupled to the substrate 202 through the plurality of pillar interconnects 240 and/or the plurality of solder interconnects 242. The integrated device 206 is coupled to the substrate 202 through the plurality of pillar interconnects 260 and/or the plurality of solder interconnects 262. Portions of the integrated device 204 and portions of the integrated device 206 may be located over the cavity 209. The integrated device 204 may be coupled to the substrate 202 such that the front side (e.g., active side) of the integrated device 204 is facing the substrate 202. Similarly, the integrated device 206 may be coupled to the substrate 202 such that the front side of the integrated device 206 is facing the substrate 202. Stage 2 of FIG. 17A illustrates and describes an example of coupling integrated devices to a substrate.

The method forms (at 1815) at least one underfill between the integrated devices and a substate. For example, the method may provide an underfill 1740 between the substrate 202 and the integrated device 204, and an underfill 1760 between the substrate 202 and the integrated device 206. The underfill (e.g., 1740, 1760) may be provided around the pillar interconnects (e.g., 240, 260) and/or the solder interconnects (e.g., 242, 262) through capillary action and/or forces. The capillary properties of the underfill allow the underfill to fill the small space and/or small gap between the integrated devices and the substrate. Stage 3 of FIG. 17A illustrates and describes an example of providing an underfill.

The method couples (at 1820) an interconnect integrated device to integrated devices. For example, the method may couple the interconnect integrated device 201 to the integrated device 204 and the integrated device 206. The interconnect integrated device 201 is coupled to the integrated device 204 through a plurality of pillar interconnects 230 and/or a plurality of solder interconnects 232. Similarly, the interconnect integrated device 201 is coupled to the integrated device 206 through a plurality of pillar interconnects 230 and/or a plurality of solder interconnects 232. In some implementations, the substrate 202 and the integrated devices 204 and 206 are flipped before the interconnect integrated device 201 is coupled to the integrated devices 204 and 206. A reflow solder process may be used to couple the interconnect integrated device 201 to the integrated devices 204 and 206. Stage 4 of FIG. 17A illustrates and describes an example of coupling an interconnect integrated device to integrated devices.

The method may also provide (at 1820) an underfill between an interconnect integrated device and integrated devices. For example, the method may provide an underfill 208 between the interconnect integrated device 201 and the integrated devices 204 and 206. The underfill 208 may be provided through capillary action and/or forces. The capillary properties of the underfill allow the underfill to fill the small space and/or small gap between the integrated devices and the substrate. The underfill 208 may include the underfill 1740 and the underfill 1760. As mentioned above, the underfill 208 helps provide mechanical coupling between the interconnect integrated device 201 and the integrated devices 204 and 206. Stage 5 of FIG. 17B illustrates and describes an example of providing an underfill.

The method may form (at 1825) an encapsulation layer over a substrate. For example, the method may form the encapsulation layer 508 over the first surface of the substrate 202 such that the encapsulation layer 508 encapsulates the first integrated device 204 and the second integrated device. The process of forming and/or depositing the encapsulation layer 508 may include using a compression and transfer molding process, a sheet molding process, or a liquid molding process. It is noted that in some implementations, the encapsulation layer 508 may replace the underfill (e.g., 1740, 1760, 208), as described in FIG. 7. Thus, in some implementations, the encapsulation layer 508 may be formed and located in regions that are occupied by the underfill. Stage 6 of FIG. 17B illustrates and describes an example of forming an encapsulation layer.

The method couples (at 1830) a plurality of solder interconnects (e.g., 280) to the second surface of the substrate (e.g., 202). A reflow solder process may be used to couple the plurality of solder interconnects. Stage 7 of FIG. 17B, illustrates and describes an example of coupling solder interconnects to the substrate.

Exemplary Electronic Devices

Figure 19:
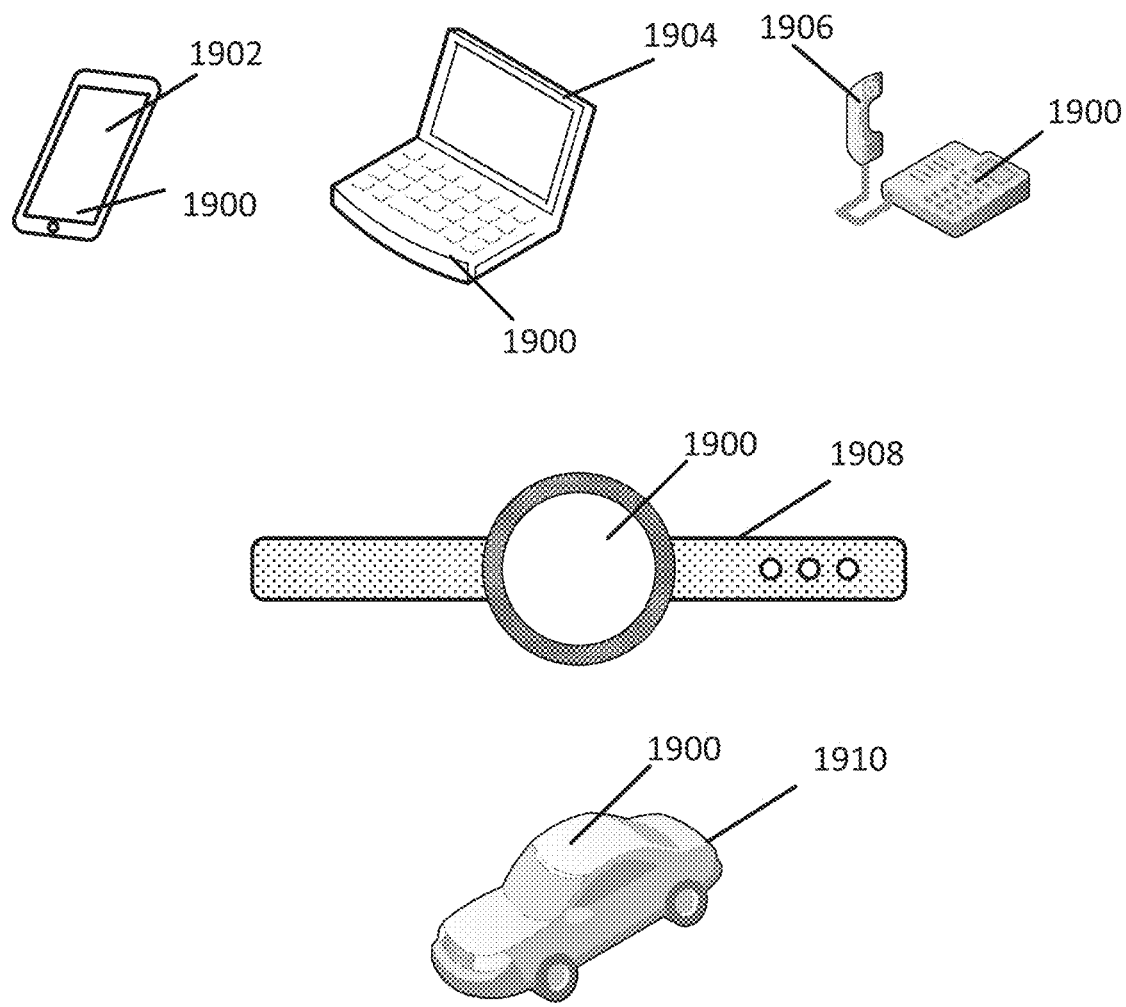
FIG. 19 illustrates various electronic devices that may integrate a die, an electronic circuit, an integrated device, an integrated passive device (IPD), a passive component, a package, and/or a device package described herein.

FIG. 19 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1902, a laptop computer device 1904, a fixed location terminal device 1906, a wearable device 1908, or automotive vehicle 1910 may include a device 1900 as described herein. The device 1900 may be, for example, any of the devices and/or integrated circuit (IC) packages described herein. The devices 1902, 1904, 1906 and 1908 and the vehicle 1910 illustrated in FIG. 19 are merely exemplary. Other electronic devices may also feature the device 1900 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-7, 8A-8D, 9, 10-11, 12A-12B, 13A-13B, 14, 15A-15C, 16, 17A-17B, and/or 18-19 may be rearranged and/or combined into a single component, process, feature or function or embodied in several components, processes, or functions. Additional elements, components, processes, and/or functions may also be added without departing from the disclosure. It should also be noted FIGS. 2-7, 8A-8D, 9, 10-11, 12A-12B, 13A-13B, 14, 15A-15C, 16, 17A-17B, and/or 18-19 and its corresponding description in the present disclosure is not limited to dies and/or ICs. In some implementations, FIGS. 2-7, 8A-8D, 9, 10-11, 12A-12B, 13A-13B, 14, 15A-15C, 16, 17A-17B, and/or 18-19 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

A first aspect includes a package comprising a substrate comprising a cavity, a first integrated device coupled to the substrate, a second integrated device coupled to the substrate, an interconnect integrated device coupled to the first integrated device and the second integrated device, wherein the interconnect integrated device is located over the cavity of the substrate, and an underfill located (i) between the first integrated device and the substrate, (ii) between the second integrated device and the substrate, (iii) between the interconnect integrated device and the first integrated device, and (iv) between the interconnect integrated device and the second integrated device. The first integrated device, the second integrated device and the interconnect integrated device may be configured to provide an electrical path for an electrical signal between the first integrated device and the second integrated device, that extends through the interconnect integrated device and bypasses the substrate. The underfill may comprise a viscosity of approximately 10-30 pascal second (Pa·s). The underfill may comprise a coefficient of thermal expansion (CTE) of approximately 10-15 part per million (ppm). The underfill may comprise a filler that represents approximately 50-90 percent of the weight of the underfill. The underfill may comprise an encapsulation layer. The interconnect integrated device may comprise a die substrate, at least one dielectric layer and a plurality of interconnects. The die substrate may include silicon, glass and/or quartz. The interconnect integrated device may include a high-density interconnect integrated device that is configured to have interconnects with a lower minimum width and spacing than the minimum width and spacing of interconnects from the substrate. A minimum width for the plurality of interconnects of the interconnect integrated device may be in a range of approximately 2-5 micrometers (μm), and a minimum spacing for the plurality of interconnects of the interconnect integrated device may be in a range of approximately 2-5 micrometers (μm). The interconnect integrated device may include a die that is free of a transistor coupled to a circuit. The interconnect integrated device may be located at least partially in the cavity of the substrate. The underfill may be further located over the first integrated device and the second integrated device. The underfill may be further located in the cavity of the substrate. The package may further comprise an encapsulation layer located over the substrate. The package may further comprise an encapsulation layer located in the cavity of the substrate. The interconnect integrated device may be coupled to the first integrated device through a first plurality of solder interconnects and a first plurality of pillar interconnects. The interconnect integrated device may be coupled to the second integrated device through a second plurality of solder interconnects and a second plurality of pillar interconnects. The underfill may comprises a capillary underfill and/or a mold underfill.

A second aspect includes an apparatus comprising a substrate comprising a cavity, a first integrated device coupled to the substrate, a second integrated device coupled to the substrate, means for integrated device interconnection coupled to the first integrated device and the second integrated device, wherein the means for integrated device interconnection is located over the cavity of the substrate, and an underfill located (i) between the first integrated device and the substrate, (ii) between the second integrated device and the substrate, (iii) between the means for integrated device interconnection and the first integrated device, and (iv) between the means for integrated device interconnection and the second integrated device. The first integrated device, the second integrated device and the means for integrated device interconnection may be configured to provide an electrical path for an electrical signal between the first integrated device and the second integrated device, that extends through the means for integrated device interconnection and bypasses the substrate. The underfill may comprise a capillary underfill and/or a mold underfill. The underfill may comprise a viscosity of approximately 10-30 pascal second (Pa·s). The underfill may comprise a coefficient of thermal expansion (CTE) of approximately 10-15 part per million (ppm). The underfill may comprise a filler that represents approximately 50-90 percent of the weight of the underfill. The means for integrated device interconnection may comprise a die substrate, at least one dielectric layer and a plurality of interconnects. The die substrate may include silicon, glass and/or quartz. A minimum width for the plurality of interconnects of the interconnect integrated device may be in a range of approximately 2-5 micrometers (μm). A minimum spacing for the plurality of interconnects of the interconnect integrated device may be in a range of approximately 2-5 micrometers (μm). The means for integrated device interconnection may include a die that is free of a transistor coupled to a circuit. The apparatus may include a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

A third aspect includes a method for fabricating a package. The method provides a substrate comprising a cavity. The method couples a first integrated device to the substrate. The method couples a second integrated device to the substrate. The method couples an interconnect integrated device to the first integrated device and the second integrated device, wherein the interconnect integrated device is located over the cavity of the substrate. The method forms an underfill (i) between the first integrated device and the substrate, (ii) between the second integrated device and the substrate, (iii) between the interconnect integrated device and the first integrated device, and (iv) between the interconnect integrated device and the second integrated device.

The first integrated device, the second integrated device and the interconnect integrated device may be configured to provide an electrical path for an electrical signal between the first integrated device and the second integrated device, that extends through the interconnect integrated device and bypasses the substrate. The underfill may comprise a viscosity of approximately 10-30 pascal second (Pa·s). The underfill may comprise a coefficient of thermal expansion (CTE) of approximately 10-15 part per million (ppm). The underfill may comprise a filler that represents approximately 50-90 percent of the weight of the underfill. The interconnect integrated device may comprise a die substrate, at least one dielectric layer and a plurality of interconnects. The interconnect integrated device may include a die that is free of a transistor coupled to a circuit. The underfill may comprise a capillary underfill and/or a mold underfill.

The invention claimed is:

1. A package comprising:
   a substrate comprising a cavity that extends through an entire thickness of the substrate;
   a first integrated device coupled to the substrate, wherein the first integrated device includes a first front side that faces in a direction towards the substrate;
   a second integrated device coupled to the substrate, wherein the second integrated device includes a second front side that faces in a direction towards the substrate;
   an interconnect integrated device coupled to the first integrated device and the second integrated device, wherein the interconnect integrated device is located (i) over the cavity of the substrate and (ii) only partially in the cavity of the substrate; and
   an underfill configured to underfill the first integrated device and the second integrated device, the underfill located (i) between the first integrated device and the substrate, (ii) between the second integrated device and the substrate, (iii) between the interconnect integrated device and the first integrated device, and (iv) between the interconnect integrated device and the second integrated device, and
   wherein the underfill is a single underfill layer that directly touches (i) the first front side of the first integrated device, (ii) the second front side of the second integrated device and (iii) a surface of the substrate, and
   wherein the underfill is further located in at least part of the cavity of the substrate.

2. The package of claim 1, wherein the first integrated device, the second integrated device and the interconnect integrated device are configured to provide an electrical path for an electrical signal between the first integrated device and the second integrated device, that extends through the interconnect integrated device and bypasses the substrate.

3. The package of claim 1, wherein the underfill comprises a viscosity of approximately 10-30 pascal second (Pa·s).

4. The package of claim 1, wherein the underfill comprises a filler that represents approximately 50-90 percent of the weight of the underfill.

5. The package of claim 1,
   wherein the interconnect integrated device comprises a die substrate, at least one dielectric layer and a plurality of interconnects, and
   wherein a first portion of (i) the at least one dielectric layer and (ii) the plurality of interconnects, is located in the cavity of the substrate, and
   wherein a second portion of (i) the at least one dielectric layer and (ii) the plurality of interconnects, is located outside of the cavity of the substrate.

6. The package of claim 5, wherein the die substrate includes silicon, glass and/or quartz.

7. The package of claim 5,
   wherein a minimum width for the plurality of interconnects of the interconnect integrated device is in a range of approximately 2-5 micrometers (µm), and
   wherein a minimum spacing for the plurality of interconnects of the interconnect integrated device is in a range of approximately 2-5 micrometers (µm).

8. The package of claim 1, wherein the interconnect integrated device includes a die that is free of a transistor coupled to a circuit.

9. The package of claim 1, wherein the underfill is further located over the first integrated device and the second integrated device.

10. The package of claim 1, further comprising an encapsulation layer located over the substrate, wherein the encapsulation layer is a different layer from the underfill layer.

11. The package of claim 1, further comprising an encapsulation layer coupled to the underfill, wherein the encapsulation layer is a different layer from the underfill layer.

12. The package of claim 1,
    wherein the interconnect integrated device is coupled to the first integrated device through a first plurality of solder interconnects and a first plurality of pillar interconnects such that (i) the first plurality of solder interconnects directly touch the first integrated device and the first plurality of pillar interconnects and (ii) the first plurality of pillar interconnects directly touch the interconnect integrated device,
    wherein the interconnect integrated device is coupled to the second integrated device through a second plurality of solder interconnects and a second plurality of pillar interconnects such that (i) the second plurality of solder interconnects directly touch the second integrated device and the second plurality of pillar interconnects and (ii) the second plurality of pillar interconnects directly touch the interconnect integrated device,
    wherein the first integrated device is coupled to the substrate through a third plurality of pillar interconnects and a third plurality of solder interconnects such that (i) the third plurality of solder interconnects directly touch the substrate and the third plurality of pillar interconnects and (ii) the third plurality of pillar interconnects directly touch the first integrated device, and
    wherein the second integrated device is coupled to the substrate through a fourth plurality of pillar interconnects and a fourth plurality of solder interconnects such that (i) the fourth plurality of solder interconnects directly touch the substrate and the fourth plurality of pillar interconnects and (ii) the fourth plurality of pillar interconnects directly touch the second integrated device.

13. The package of claim 1, wherein the underfill comprises a capillary underfill and/or a mold underfill.

14. An apparatus comprising:
    a substrate comprising a cavity through an entire thickness of the substrate;
    a first integrated device coupled to the substrate through a first plurality of pillar interconnects and a first plurality of solder interconnects, wherein the first plurality of pillar interconnects are coupled to and directly touch the first integrated device, and
wherein the first plurality of solder interconnects directly touch the first plurality of pillar interconnects and the substrate;
a second integrated device coupled to the substrate through a second plurality of pillar interconnects and a second plurality of solder interconnects,
wherein the second plurality of pillar interconnects are coupled to and directly touch the second integrated device, and
wherein the second plurality of solder interconnects directly touch the second plurality of pillar interconnects and the substrate;
a means for integrated device interconnection coupled to the first integrated device and the second integrated device through a third plurality of pillar interconnects and a third plurality of solder interconnects,
wherein the third plurality of pillar interconnects are coupled to the means for integrated device interconnection,
wherein a first set of solder interconnects from the third plurality of solder interconnects directly touch the first integrated device,
wherein a second set of solder interconnects from the third plurality of solder interconnects directly touch the second integrated device, and
wherein the means for integrated device interconnection is located over the cavity of the substrate; and
an underfill configured to underfill the first integrated device and the second integrated device, the underfill located (i) between the first integrated device and the substrate, (ii) between the second integrated device and the substrate, (iii) between the means for integrated device interconnection and the first integrated device, and (iv) between the means for integrated device interconnection and the second integrated device, and
wherein the underfill is a single underfill layer that directly touches a first front side of the first integrated device, a second front side of the second integrated device, a surface of the substrate, the first plurality of pillar interconnects and the second plurality of pillar interconnects, and
wherein the underfill is further located in at least part of the cavity of the substrate.

15. The apparatus of claim 14, wherein the first integrated device, the second integrated device and the means for integrated device interconnection are configured to provide an electrical path for an electrical signal between the first integrated device and the second integrated device, that extends through the means for integrated device interconnection and bypasses the substrate.

16. The apparatus of claim 14, wherein the underfill comprises a capillary underfill and/or a mold underfill.

17. The apparatus of claim 14, wherein the underfill comprises a viscosity of approximately 10-30 pascal second (Pa·s).

18. The apparatus of claim 14, wherein the underfill comprises a filler that represents approximately 50-90 percent of the weight of the underfill.

19. The apparatus of claim 14,
wherein the means for integrated device interconnection comprises a die substrate, at least one dielectric layer and a plurality of interconnects, and
wherein a front side of the means for integrated device interconnection faces in the direction of the first integrated device and the second integrated device.

20. The apparatus of claim 19, wherein the die substrate includes silicon, glass and/or quartz.

21. The apparatus of claim 19,
wherein a minimum width for the plurality of interconnects of the means for integrated device interconnection is in a range of approximately 2-5 micrometers (μm), and
wherein a minimum spacing for the plurality of interconnects of the means for integrated device interconnection is in a range of approximately 2-5 micrometers (μm).

22. The apparatus of claim 14,
wherein the means for integrated device interconnection includes a die that is free of a transistor coupled to a circuit, and
wherein a front side of the means for integrated device interconnection faces in the direction of the first integrated device and the second integrated device.

23. The apparatus of claim 14, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IOT) device, and a device in an automotive vehicle.

24. The apparatus of claim 14,
wherein the first front side of the first integrated device faces in a direction towards the substrate and the second front side of the second integrated device faces in a direction towards the substrate, and
wherein a coupling between the third plurality of pillar interconnects and the means for integrated device interconnection is free of solder interconnects.

25. A method for fabricating a package, comprising:
providing a substrate comprising a cavity that extends through an entire thickness of the substrate;
coupling a first integrated device to the substrate through a first plurality of pillar interconnects and a first plurality of solder interconnects,
wherein the first plurality of pillar interconnects are coupled to and directly touch the first integrated device, and
wherein the first plurality of solder interconnects directly touch the first plurality of pillar interconnects and the substrate;
coupling a second integrated device to the substrate through a second plurality of pillar interconnects and a second plurality of solder interconnects,
wherein the second plurality of pillar interconnects are coupled to and directly touch the second integrated device, and
wherein the second plurality of solder interconnects directly touch the second plurality of pillar interconnects and the substrate;
coupling an interconnect integrated device to the first integrated device and the second integrated device through a third plurality of pillar interconnects and a third plurality of solder interconnects,
wherein the third plurality of pillar interconnects are coupled to the interconnect integrated device,
wherein a first set of solder interconnects from the third plurality of solder interconnects are coupled to the first integrated device, wherein a second set of solder interconnects from the third plurality of solder interconnects are coupled to the second integrated device, and wherein the interconnect integrated device is located over the cavity of the substrate; and forming an underfill configured to underfill the first integrated device and the second integrated device, the underfill located (i) between the first integrated device and the substrate, (ii) between the second integrated device and the substrate, (iii) between the interconnect integrated device and the first integrated device, and (iv) between the interconnect integrated device and the second integrated device, and wherein the underfill is formed such that the underfill is a single underfill layer that directly touches (i) a first horizontal surface of the first integrated device and (ii) a second horizontal surface of the second integrated device, and (iii) a surface of the substrate, and wherein forming the underfill further comprises forming the underfill in at least part of the cavity of the substrate.

26. The method of claim 25, wherein the first integrated device, the second integrated device and the interconnect integrated device are configured to provide an electrical path for an electrical signal between the first integrated device and the second integrated device, that extends through the interconnect integrated device and bypasses the substrate.

27. The method of claim 25, wherein the underfill comprises a viscosity of approximately 10-30 pascal second (Pa·s).

28. The method of claim 25, wherein the underfill comprises a filler that represents approximately 50-90 percent of the weight of the underfill.

29. The method of claim 25, wherein the interconnect integrated device comprises a die substrate, at least one dielectric layer and a plurality of interconnects.

30. The method of claim 25, wherein the interconnect integrated device includes a die that is free of a transistor coupled to a circuit.

31. The method of claim 25, wherein the underfill comprises a capillary underfill and/or a mold underfill.

32. The method of claim 25, wherein the interconnect integrated device includes a third horizontal surface closest to either the first integrated device or the second integrated device and the substrate includes a fourth horizontal surface closest to either the first integrated device or the second integrated device, the third horizontal surface is in a first horizontal plane and the fourth horizontal surface is in a second horizontal plane, the first horizontal plane is above the second horizontal plane.

* * * * *